(12) United States Patent
Smit et al.

(10) Patent No.: US 8,908,342 B2
(45) Date of Patent: Dec. 9, 2014

(54) SYSTEMS, METHODS AND APPARATUS FOR PROTECTING POWER DISTRIBUTION FEEDER SYSTEMS

(71) Applicants: Andre Smit, Raleigh, NC (US); Alexandr S. Stinskiy, Knightdale, NC (US)

(72) Inventors: Andre Smit, Raleigh, NC (US); Alexandr S. Stinskiy, Knightdale, NC (US)

(73) Assignee: Siemens Industry, Inc., Alpharetta, GA (US)

( * ) Notice: Subject to any disclaimer, the term of this patent is extended or adjusted under 35 U.S.C. 154(b) by 122 days.

(21) Appl. No.: 13/856,173

(22) Filed: Apr. 3, 2013

(65) Prior Publication Data

US 2013/0265680 A1    Oct. 10, 2013

Related U.S. Application Data

(60) Provisional application No. 61/619,965, filed on Apr. 4, 2012, provisional application No. 61/619,972, filed on Apr. 4, 2012.

(51) Int. Cl.
*H02H 3/00* (2006.01)
*H02H 7/22* (2006.01)
*H02H 7/26* (2006.01)
*G01R 19/25* (2006.01)

(52) U.S. Cl.
CPC ............. *H02H 7/22* (2013.01); *H02H 7/261* (2013.01); *G01R 19/2513* (2013.01)
USPC .............................................. 361/64; 361/62

(58) Field of Classification Search
USPC ...................................................... 361/62–69
See application file for complete search history.

(56) References Cited

U.S. PATENT DOCUMENTS

| | | | | |
|---|---|---|---|---|
| 5,973,899 A | * | 10/1999 | Williams et al. | ................. 361/72 |
| 7,110,231 B1 | | 9/2006 | De La Ree | |
| 2008/0225452 A1 | * | 9/2008 | Stoupis et al. | .................. 361/62 |
| 2011/0144931 A1 | | 6/2011 | Smit | |
| 2012/0265360 A1 | | 10/2012 | Smit | |
| 2013/0090775 A1 | | 4/2013 | Smit | |

OTHER PUBLICATIONS

PCT International Search Report mailed Oct. 7, 2013 corresponding to PCT International Application No. PCT/US2013/035245 filed Apr. 4, 2013 (13 pages).

* cited by examiner

*Primary Examiner* — Danny Nguyen

(57) ABSTRACT

A power distribution feeder system includes a plurality of power sources, a plurality of switching components coupled to the power sources by a plurality of line sections, and an IED coupled to each switching component and configured to monitor any line section coupled to the switching component, each IED containing protection logic configured to detect a jump in current on a faulted line section, communicate the jump in current to other IEDs coupled to the faulted line section, receive information from the other IEDs coupled to the faulted line section regarding any jump in current detected by the other IEDs, employ the received information from the other IEDs to confirm a fault in the faulted line section, and issue a trip command to isolate the faulted line section based on the current jump detected by the IED and current jump information received from other IEDs coupled to the line section.

32 Claims, 19 Drawing Sheets

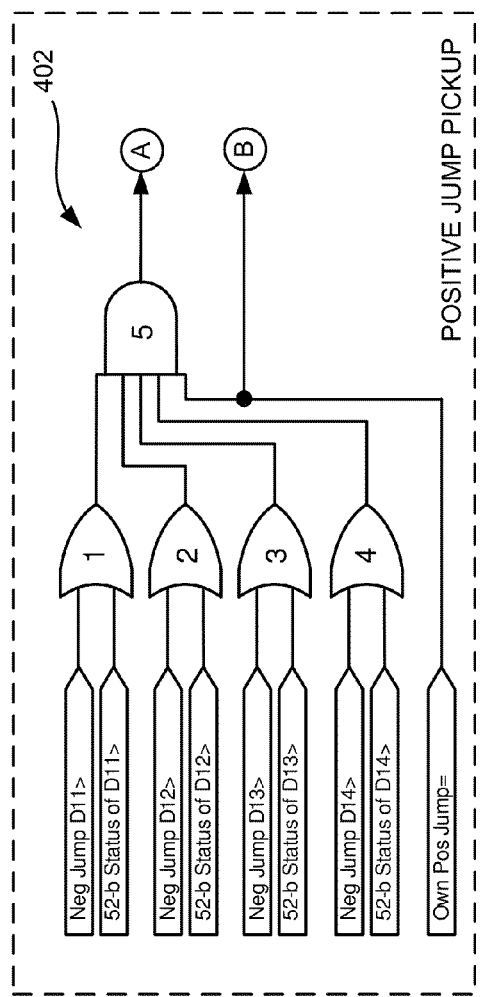
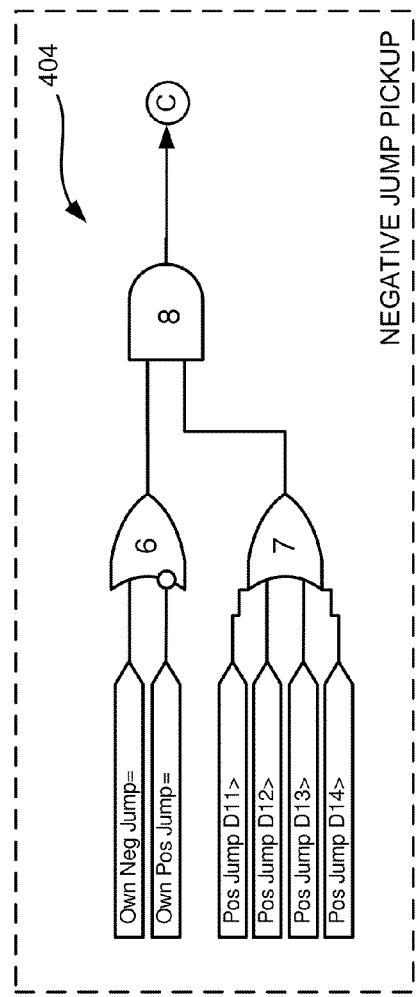
FIG. 6A
FIG. 7A

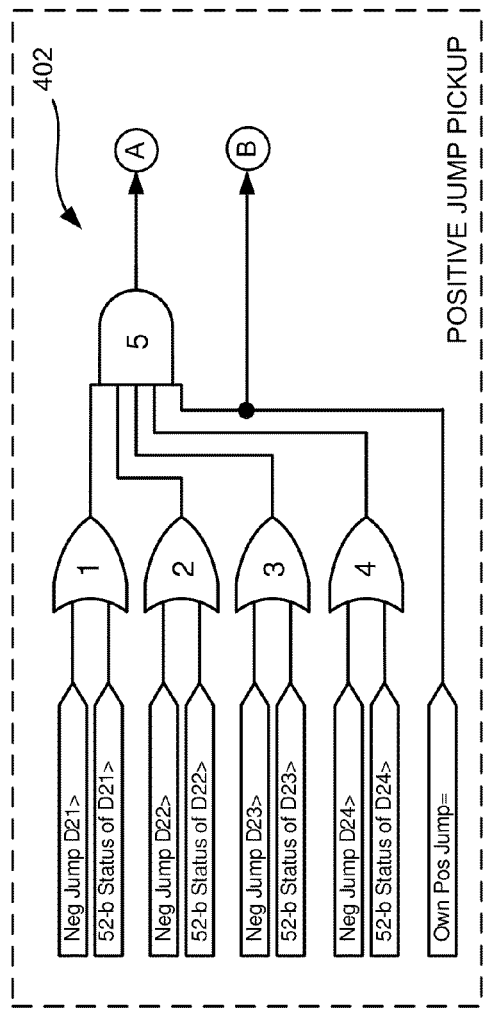
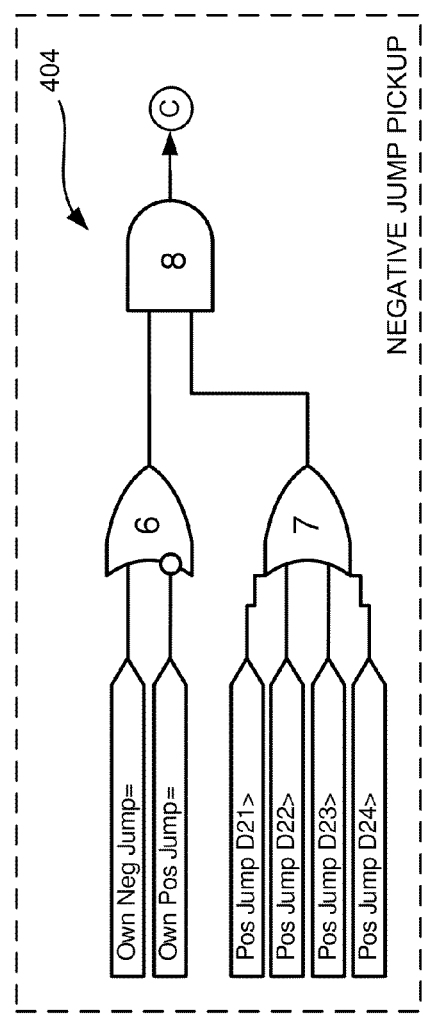
FIG. 6B
FIG. 7B

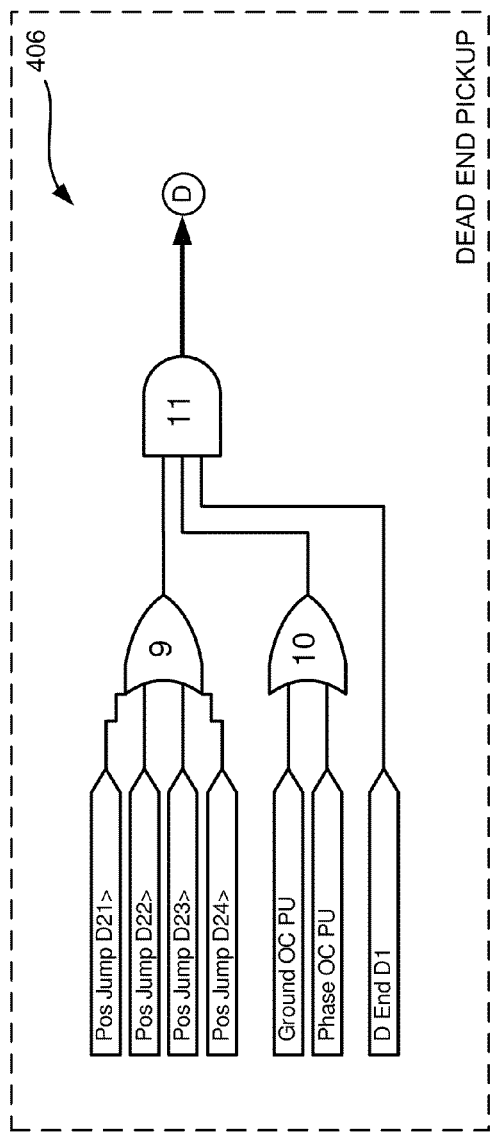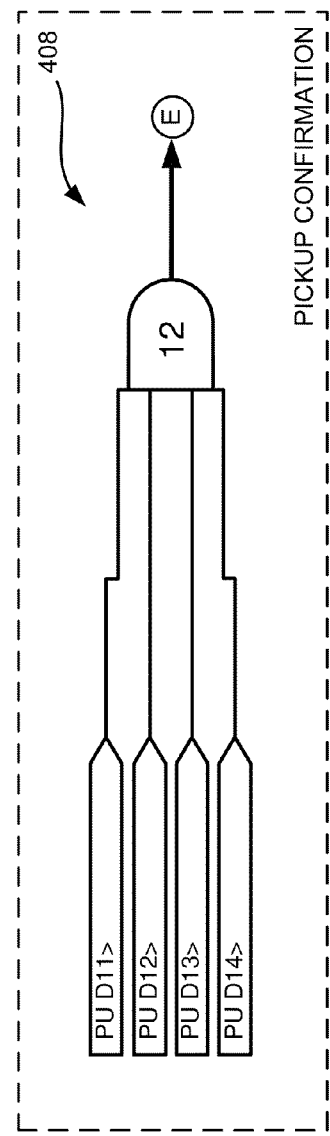

SYSTEMS, METHODS AND APPARATUS FOR PROTECTING POWER DISTRIBUTION FEEDER SYSTEMS

The present application claims priority from U.S. Provisional Patent Application Ser. No. 61/619,965, filed Apr. 4, 2012 and titled "Transforming a Peer to Peer to Peer RMS or Jump Detector" and U.S. Provisional Patent Application Ser. No. 61/619,972, filed Apr. 4, 2012 and titled "Transforming a Peer to Peer to Peer RMS or Jump Detector Type Differential Function," each of which is hereby incorporated by reference herein in its entirety for all purposes.

FIELD

The present application relates to power distribution feeder systems, and more specifically to systems, methods and apparatus for protecting power distribution feeder systems.

BACKGROUND

Protection of power distribution systems involves detecting, locating and removing faults from the power systems. Conventional protection methods for automated power distribution feeder systems employ complex adaptive time-coordinated overcurrent schemes. Selective tipping to isolate faulted line sections is achieved through a time-coordination of overcurrent functions of downstream devices. These protection systems are typically used for static feeder topologies; and slight variations to feeder topology further increase complexity.

Conventional protection devices may provide about four to eight setting groups to address operation in different topologies. Calculating the time-coordinated I-V curves for these multiple setting groups is complicated and costly. Highly accurate information regarding feeder characteristics must be gathered to calculate the required coordinated overcurrent settings for a feeder system. If the feeder system is to be completely automated, so that the feeder topology may change between all possible switching topologies, the number of time-coordinated setting groups may exceed the available setting groups in the protection devices.

As such, a need exists for improved systems, methods and apparatus for protecting power distribution feeder systems.

SUMMARY

In some embodiments, a power distribution feeder system is provided that includes (1) a plurality of power sources; (2) a plurality of switching components coupled to the power sources by a plurality of line sections; and (3) an intelligent electronic device (IED) coupled to each switching component and configured to monitor any line section coupled to the switching component, each IED containing protection logic configured to (a) detect a jump in current on a faulted line section; (b) communicate the jump in current to other IEDs coupled to the faulted line section; (c) receive information from the other IEDs coupled to the faulted line section regarding any jump in current detected by the other IEDs; (d) employ the received information from the other IEDs to confirm a fault in the faulted line section; and (e) issue a trip command to isolate the faulted line section based on the current jump detected by the IED and current jump information received from other IEDs coupled to the line section.

In some embodiments, an IED is provided for use in a power distribution feeder system having a plurality of power sources and a plurality of switching components coupled to the power sources by a plurality of line sections. The IED includes protection logic configured to (a) detect a jump in current on a faulted line section; (b) communicate the jump in current to other IEDs coupled to the faulted line section; (c) receive information from the other IEDs coupled to the faulted line section regarding any jump in current detected by the other IEDs; (d) employ the received information from the other IEDs to confirm a fault in the faulted line section; and (e) issue a trip command to isolate the faulted line section based on the current jump detected by the IED and current jump information received from other IEDs coupled to the line section.

In some embodiments, a method is provided for isolating a fault in a power distribution feeder system having a plurality of power sources and a plurality of switching components coupled to the power sources by a plurality of line sections. The method including (1) providing an IED coupled to each switching component and configured to monitor any line section coupled to the switching component; and (2) employing a first IED to (a) detect a jump in current on a faulted line section; (b) communicate the jump in current to other IEDs coupled to the faulted line section; (c) receive information from the other IEDs coupled to the faulted line section regarding any jump in current detected by the other IEDs; (d) employ the received information from the other IEDs to confirm a fault in the faulted line section; and (e) issue a trip command to isolate the faulted line section based on the current jump detected by the first IED and current jump information received from other IEDs coupled to the line section. Numerous other embodiments are provided.

Numerous other aspects are provided. Other features and aspects of the present invention will become more fully apparent from the following detailed description, the appended claims and the accompanying drawings.

BRIEF DESCRIPTION OF THE FIGURES

FIGS. 6A-6B are schematic diagrams of example positive jump pickup logic provided in accordance with various embodiments.

FIGS. 7A-7B are schematic diagrams of example negative jump pickup logic provided in accordance with various embodiments.

FIGS. 8A-8B are schematic diagrams of example dead end pickup logic provided in accordance with various embodiments.

FIGS. 9A-9B are schematic diagrams of example pickup confirmation logic in accordance with various embodiments.

DETAILED DESCRIPTION

As described in U.S. Patent Application Publication No. US2011/0144931, published Jun. 16, 2011 and titled "Method and Apparatus for High-Speed Fault Detection In Distribution Systems," which is hereby incorporated by reference herein in its entirety for all purposes, a power distribution system may include intelligent electronic devices (IEDs) distributed throughout the power distribution system that monitor and communicate status information, such as current and/or voltage levels, between one another in a peer-to-peer or similar configuration. The IEDs may employ a differential function to compare electrical quantities and/or other information entering and leaving protected zones, and communicate with one another to provide fast and accurate fault location information. This may allow for rapid fault detection.

In some embodiments described herein, IEDs and/or differential functions may be employed to allow rapid disconnection of faulted line sections of a power distribution feeder system without interrupting, or minimizing interruption to, non-faulted line sections. Specifically, high speed fault detection through use of IEDs and/or differential functions may be transformed into and/or otherwise used as a protective function for a power distribution system to rapidly isolated a faulted line section without interrupting, or minimizing interruption to, non-faulted line sections.

The above described protection function, also referred to herein as "differential protection" may protect either mesh or loop connected power distribution feeders with multiple line sections and protection points, equipped by IEDs. Differential protection may provide fast and/or selective fault location without the need of complicated coordinated groups of overcurrent settings. The protection algorithm may be based on fast, real-time detection of dynamic changes in the analog values, where increase or decrease of measured current is converted to a "Positive Jump" logical signal or a "Negative Jump" logical signal, respectively. These signals may be communicated to other IEDs connected to the same line section of the power distribution feeder system. For example, in some embodiments, positive and/or negative jump signals may be transmitted between IEDs over an internet protocol (IP) based communication network using the IEC 61850 standard peer-to-peer communication protocol or another suitable protocol. Each IED may include protection logic, which analyzes incoming data from other IEDs, and in some embodiments, operates the primary switching equipment when logical equations of the protection logic are fulfilled.

Figure 1:
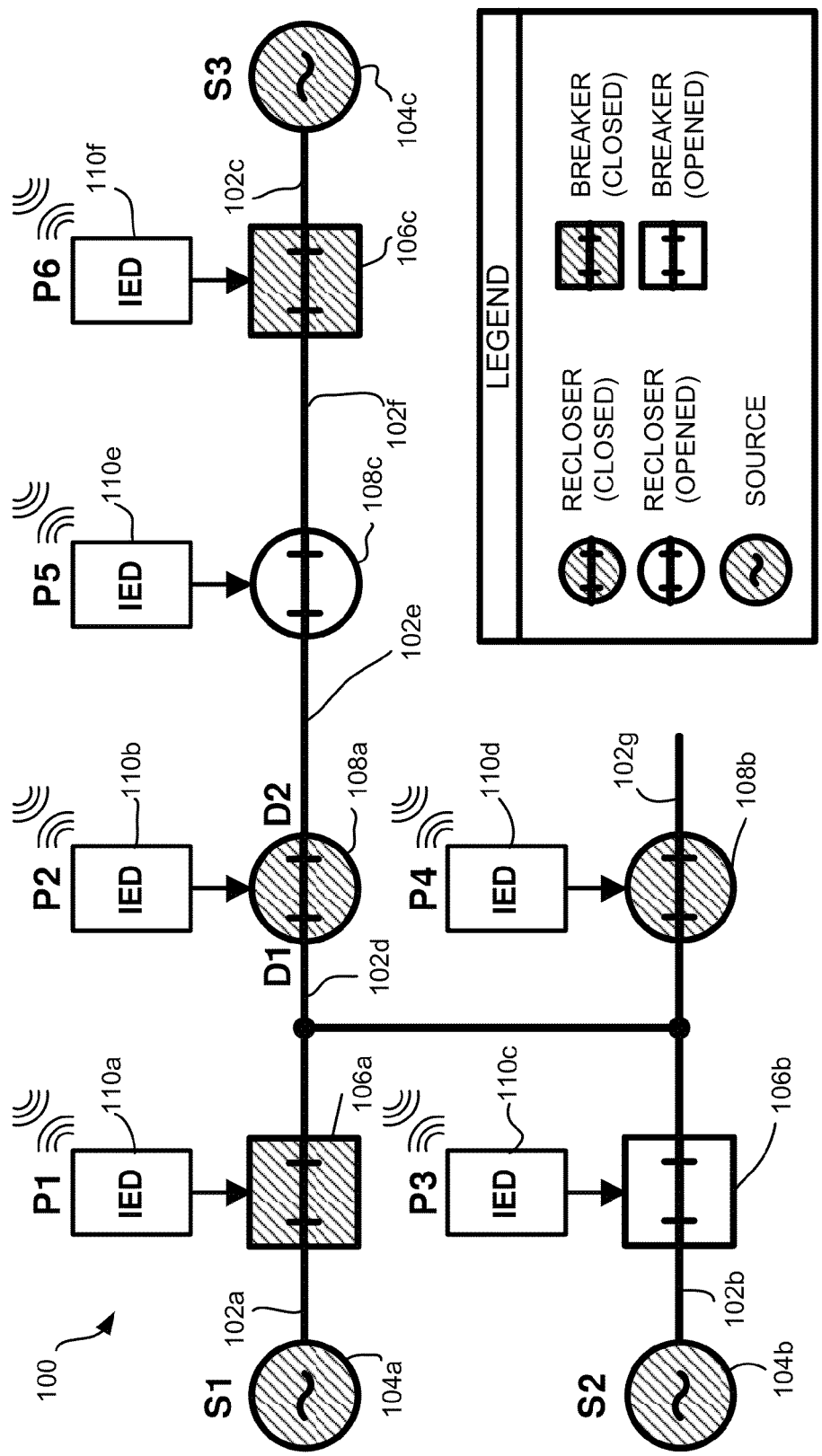
FIG. 1 is a schematic diagram of an example mesh-connected distribution feeder provided in accordance with various embodiments.

FIG. 1 is a schematic diagram of an example mesh-connected distribution feeder 100 provided in accordance with various embodiments. With reference to FIG. 1, the feeder 100 includes a plurality of line sections 102a-102g for distributing electrical power from one or more sources 104a-c to a plurality of loads (not shown). More or fewer line sections and/or sources, and/or different topologies may be employed (e.g., loop-connected feeders). Line section lengths are merely for illustrative purposes.

Line section 102a connects source 104a to first breaker 106a, line section 102b connects source 104b to second breaker 104b, and line section 102c connects source 104c to third breaker 106c. Line section 102d connects first breaker 106a, first recloser 108a, second breaker 106b and second recloser 108b. Line section 102e connects first recloser 108a to third recloser 108c. Line section 102f connects third recloser 108c to third breaker 106c. Line section 102g may connect second recloser 108b to a load, an additional recloser, a breaker or another electrical component (not shown). Any other suitable electrical components may be employed. In the embodiment of FIG. 1, breakers and reclosers are "closed" if shaded and "opened" if not shaded.

The feeder 100 includes a plurality of IEDs 110a-e (P1-P6). Any suitable IED may be employed, such as an RMS detector, a jump detector or the like. IED 110a (P1) is coupled to first breaker 106a, IED 110b (P2) is coupled to first recloser 108a, IED 110c (P3) is coupled to second breaker 106b, IED 110d (P4) is coupled to second recloser 108b, IED 110e (P5) is coupled to third recloser 108c, and IED 110f (P6) is coupled to third breaker 106c. Example IEDs are described further below.

IEDs 110a-f may communicate with each other using wired and/or wireless communication, and any suitable protocol. In some embodiments, IEDs 110a-f use a wireless or wired IP-based communication network for data exchange. To reduce bandwidth requirements of the network, protection logic within the IEDs may operate with binary signals, and/or IEDs may communicate primarily (or only) with IEDs coupled to the same line section. In FIG. 1, direction D1 is the direction extending from the left side of an IED and direction D2 is the direction extending from the right side of an IED. For example, in this topology (FIG. 1) protection logic in the IED 110b (P2) evaluates data from IEDs P1, P3 and P4 to detect a fault on line section 102d (direction D1). To detect a fault on line section 102e (direction D2), IED P2 operates primarily with signals from IED P5. Protection related information from IED P6 is not relevant and/or employed, because IED P6 is not connected to the same line section as IED P2.

In general, any IED may be connected to and/or in communication with any number of other IEDs in any direction. In the embodiment of FIG. 1, a maximum of four IEDs are shown connected to a line section. More IEDs may be employed by adding additional inputs, logic gates and/or computer program code to the IEDs. An example embodiment of an IED that may be used for one or more of the IEDs P1-P6 of FIG. 1 is described below with reference to FIG. 2.

Figure 2:
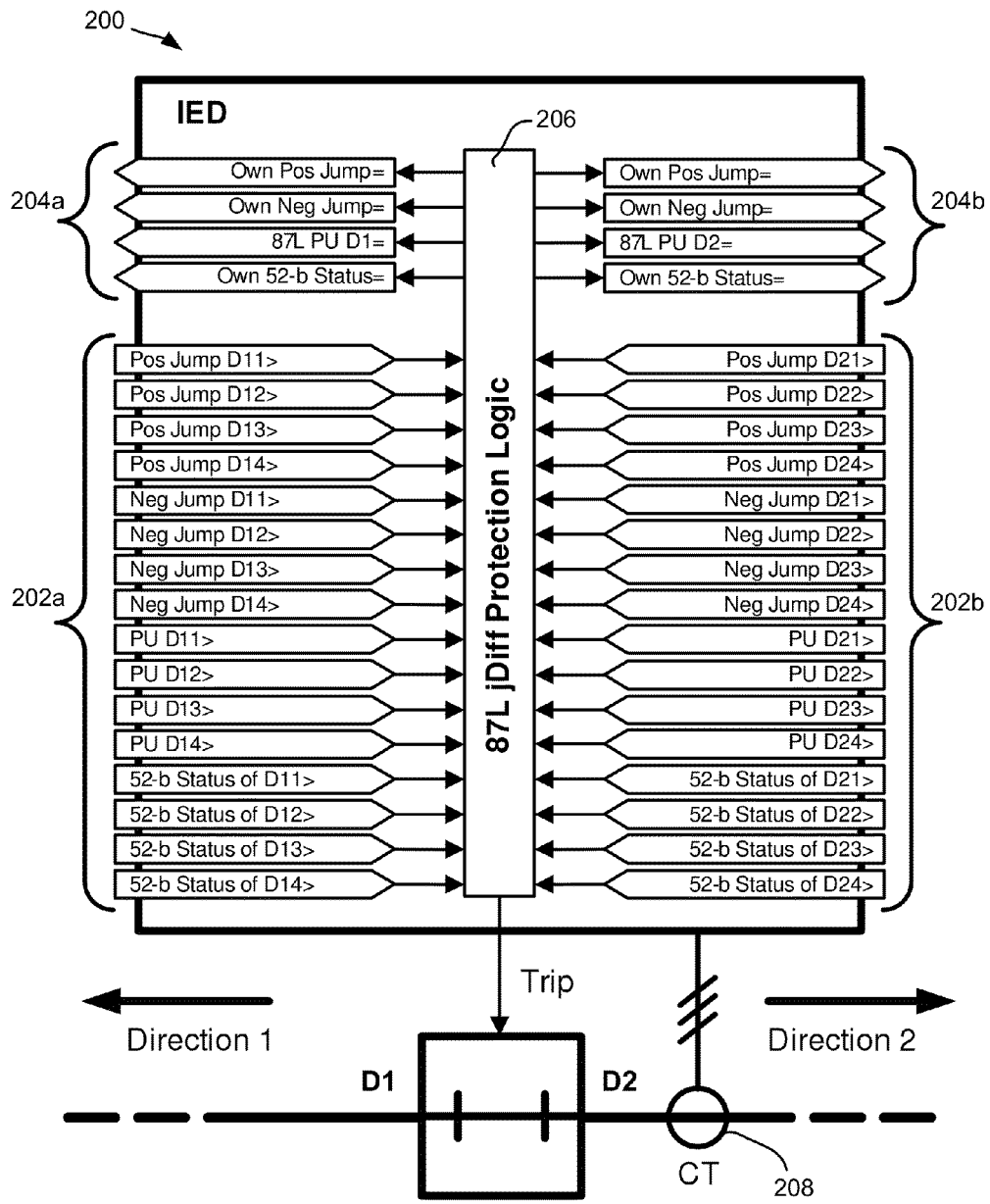
FIG. 2 is an example embodiment of an intelligent electronic device (IED) in accordance with various embodiments.

FIG. 2 is an example embodiment of an IED 200 in accordance with various embodiments. The IED 200 is configured to communicate with up to four other IEDs coupled on either side D1 or side D2 of the IED 200. As stated, the IED 200 may communicate with fewer or more IEDs. To communicate with additional IEDs, the IED 200 would be provided with additional inputs, logic and/or computer program code.

The IED 200 has a first set of inputs 202a from up to four other IEDs relating to a possible fault in a line section extending from direction D1 relative to IED 200, and a second set of inputs 202b from up to four other IEDs relating to a possible fault in a line section extending from direction D2 relative to IED 200. The IED 200 also includes a first set of outputs 204a relating a possible fault along to a line section extending from direction D1 relative to IED 200, and a second set of outputs 204b relating to a possible fault along a line section extending from direction D2 relative to IED 200. The various inputs and outputs of IED 200 are described in detail below.

IED 200 includes protection logic 206 configured to perform the protection functions described herein. Protection logic 206 may be implemented in hardware, software or a combination of the same. For example, IED 200 may include one or more microprocessors, microcontrollers, programmable logic circuits (PLCs), application specific integrated circuits (ASICs) or the like, capable of receiving, sending and/or processing data/control signals as described below. In some embodiments, IEDs may communicate with one another using a protocol such as an IEC 61850 (open standard as a part of the International Electrotechnical Commission's (IEC) Technical Committee 57 (TC57) reference architecture for electric power systems).

A high-speed communication system (such as fiber link, WiMax, WiFi, or other wired or wireless carrier technologies or a mixture thereof) may be provided between IEDs for peer-to-peer communication. For example, an Ethernet backbone may be linked over a twisted pair type copper cable, fiber or an Internet protocol (IP)-based radio system, broadband over power line (BPL) or digital subscriber line (DSL). IED 200 may be capable of exchanging messages with other IEDs, for example, using GOOSE (Generic Object Oriented Substation Event) messages under the IEC61850 Standard. Such a protocol may run over TCP/IP networks and/or substation LANs using high speed switched Ethernet. Peer-to-peer functionality via IEC 61850 GOOSE messages provides not only binary data, but analog values as well.

The IED 200 may include, for example, a central processing unit, memory, and/or other circuitry for receiving input data, processing the data as described herein and/or outputting data and/or control signals (e.g., as part of logic 206, for example). Computer program code may be provided for performing at least a portion of the methods described herein.

The IED 200 may, directly or via a recloser, circuit breaker or other electrical component, sense and/or interrupt fault currents as well as re-close and/or attempt to re-energize a line section. For example, the IED 200 may receive information from one or more current and/or voltage sensors, voltage transformers (VTs) and/or current transformers (CTs) 208, to monitor the flow of current and/or power in a line section. The CT 208 or other current and/or voltage sensor may provide input data to IED 200 for detecting positive and/or negative current jumps, for example.

In some embodiments, the protection logic 206 in IED 200 may include one or more of the inputs 202a-202b and/or outputs 204a-204b in Table 1 below:

TABLE 1

| | | |
|---|---|---|
| Own Pos Jump= | Output signal | IED issues this signal when sudden current increase (Positive Jump) is detected in any phase |
| Own Neg Jump= | Output signal | IED issues this signal when sudden current decrease (Negative Jump) is detected in any phase |
| 87L PU D1= | Output signal | IED issues this signal when 87L logic picks up in direction D1 |
| 87L PU D2= | Output signal | IED issues this signal when 87L logic picks up in direction D2 |

TABLE 1-continued

| | | |
|---|---|---|
| Own 52-b Status= | Output signal | IED issues this signal when own primary switching device (Recloser or Breaker) is open |
| Pos Jump D1X> | Input signals | Positive Jump is detected in direction D1 by IED X |
| Pos Jump D2X> | Input signals | Positive Jump is detected in direction D2 by IED X |
| Neg Jump D1X> | Input signals | Negative Jump is detected in direction D1 by IED X |
| Neg Jump D2X> | Input signals | Negative Jump is detected in direction D2 by IED X |
| PU D1X> | Input signals | 87L logic picks up in direction D1 signal from IED X |
| PU D2X> | Input signals | 87L logic picks up in direction D2 signal from IED X |
| 52-b Status of D1X> | Input signals | Switching Device is open signal from IED X in direction D1 |
| 52-b Status of D2X> | Input signals | Switching Device is open signal from IED X in direction D2 |

Figure 3A:
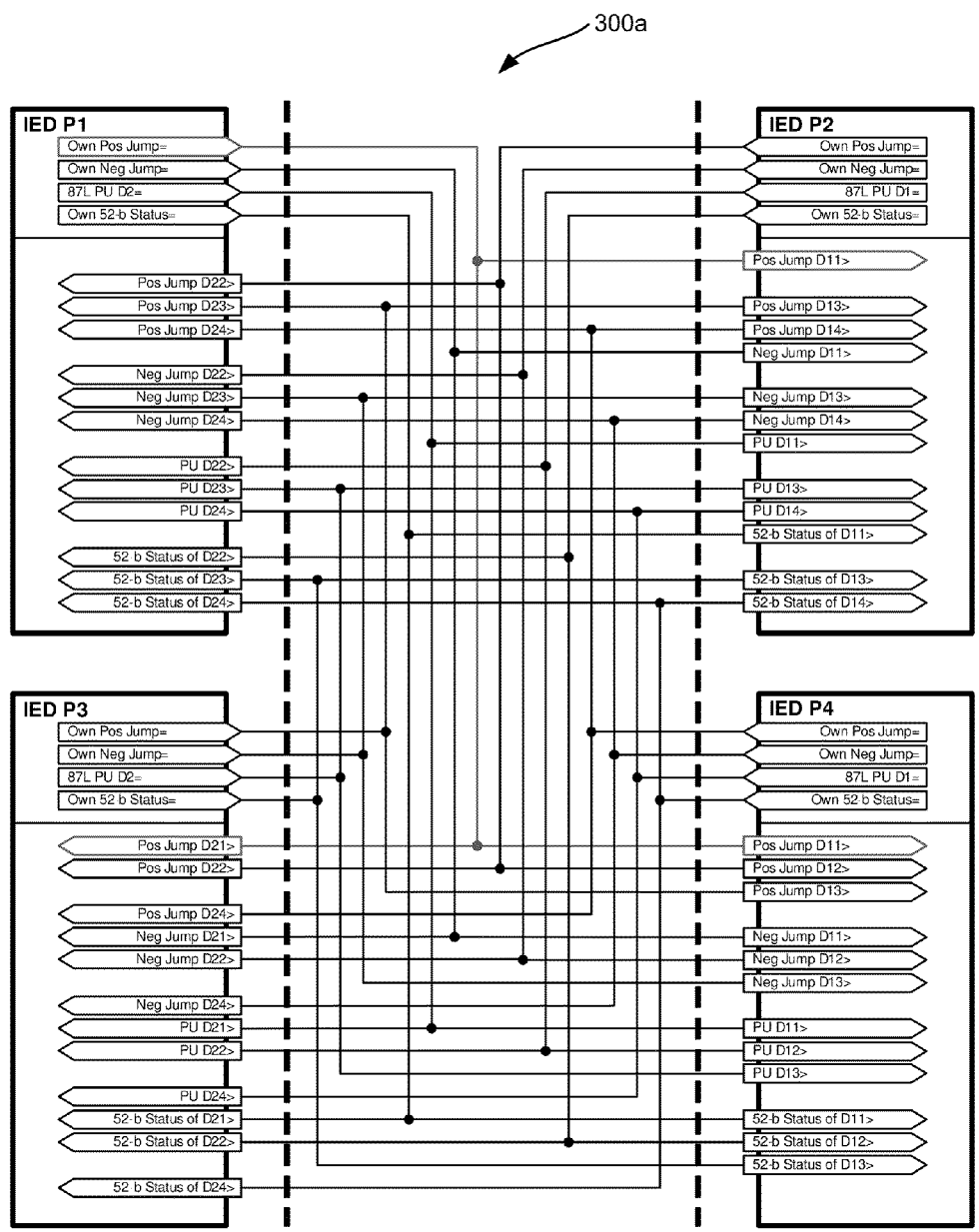
FIG. 3A is a schematic diagram of example input/output connections between IEDs of FIG. 1 in accordance with various embodiments.

Output signals from each IED are linked to appropriate inputs of all the other adjacent IEDs in direction D1 and direction D2. FIG. 3A is a schematic diagram of example input/output connections 300a between IEDs P1-P4 of FIG. 1 in accordance with various embodiments. Other configurations may be employed.

With reference to FIG. 3A, output signal "Own Pos Jump =" from IED P1 is linked to the "Pos Jump D11>" inputs of the IEDs P2 and P4. IED P3 is connected to IEDs P1, P2 and P4 in direction D2, so IED P3 may consider data from IEDs P1, P2 and P4 as signals from direction D2. Following this connection principle, "Own Pos Jump =" from IED P1 is connected to the input "Pos Jump D21>" of IED P3.

Figure 3B:
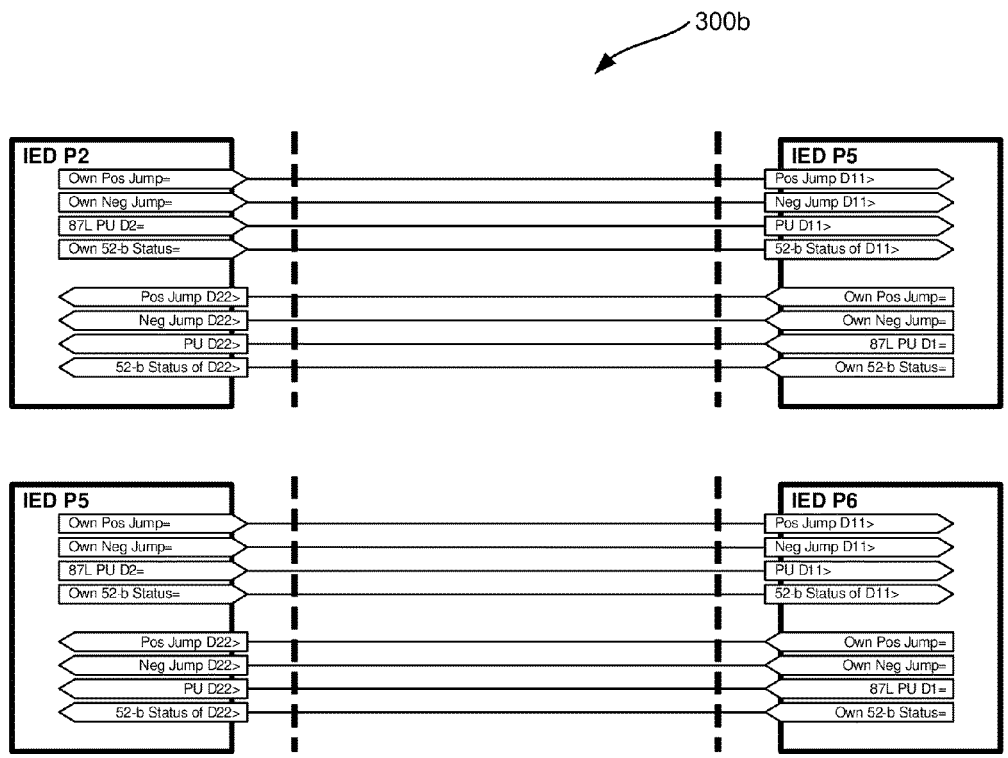
FIG. 3B is a schematic diagram of example input/output connections between other IEDs of FIG. 1 in accordance with various embodiments.

FIG. 3B is a schematic diagram of example input/output connections 300b between IEDs P2 and P5 of FIG. 1 in accordance with various embodiments. Other configurations may be employed. As shown in FIG. 3B, IED P2 is connected to IED P5 in direction D1 (relative to IED P5), so IED P5 considers signals from IED P2 as data from the direction D1. Following this connection principle, IED P2 receives signals from IED P5 as data from the direction D2 (relative to IED P2).

In some embodiments, the protection logic of each IED may perform six main actions to allow implementation of a protection function. These actions are described briefly below, primarily from the standpoint of an IED that detects a positive current jump on a line section to which the IED is connected. This IED is referred to below as the "initiating IED" and the other IEDs connected to the same line section are referred to as "responding IEDs". The six actions of the protection logic may include:

(1) Jump Detector Inhibit—if the initiating IED detects a positive jump in current, the protection logic of the initiating IED will not respond to a subsequent negative jump in current; in general, in some embodiments, any IED that responds to a positive current jump will not respond to a subsequent negative current jump, and any IED that responds to a negative current jump will not respond to a subsequent positive current jump (during a protection function cycle); each IED connected to a line section that detects a positive or negative current jump communicates the current jump to other IEDs connected to the line section;

(2) 87L Pickup Communication—the protection logic of the initiating IED issues a fault detection signal, referred to as an "87L pickup signal", to other (responding) IEDs to communicate when its logical conditions are fulfilled for a fault in direction D1 or D2;

(3) 87L Pickup Confirmation—the protection logic of the initiating IED receives an 87L pickup signal from other (responding) IEDs when their logical conditions are fulfilled for a fault in direction D1 or D2;

(4) 87L Low Current Pickup Confirmation—if the protection logic of a responding IED does not detect a negative current jump due to light loading, the responding IED may still issue an 87L pickup signal to the initiating IED (as long as the responding IED did not detect a positive current jump); in response to the 87L pickup signal from the responding IED, the initiating IED may issue an 87L pickup signal (despite having not received a negative current jump signal from the responding IED);

(5) 87L Fault Detection Confirmation—if the protection logic of the initiating IED performed all relevant actions such that a fault is detected in direction D1 or D2, the fault is confirmed from a ground and/or phase overcurrent measurement (e.g., to prevent a spurious fault or sudden change in load profile from initiating the protective function); and (6) Protection Trip—once the fault is detected and confirmed, the protection logic of the initiating IED issues a trip command to isolate the faulted line section.

Using the above six actions to detect a fault on a line section, the protection logic of an initiating IED detects a positive jump in current, ignores any subsequent negative current jump and communicates the positive current jump to other IEDs connected to the same line section (Action 1). Actions 3 and 4 are completed when other IEDs connected to the same line section detect a negative current jump, or no current jump if lightly loaded, and reply with an 87L pickup signal (which may merely be an echo signal if lightly loaded) to the other IEDs connected to the line section (Action 3 and Action 4). When all 87L pickup/echo signals are received by the protection logic of the initiating IED, the protection logic confirms the fault with a ground and/or phase current measurement (Action 5). If the fault is confirmed by ground and/or phase current measurements (Action 5), the protection logic of the initiating IED issues a trip signal to cause the primary switching device associated with the IED to open. (Note that if two Positive Jumps are detected for a line section, in some embodiments, the protection logic recognizes this as an external fault.)

Figure 4:
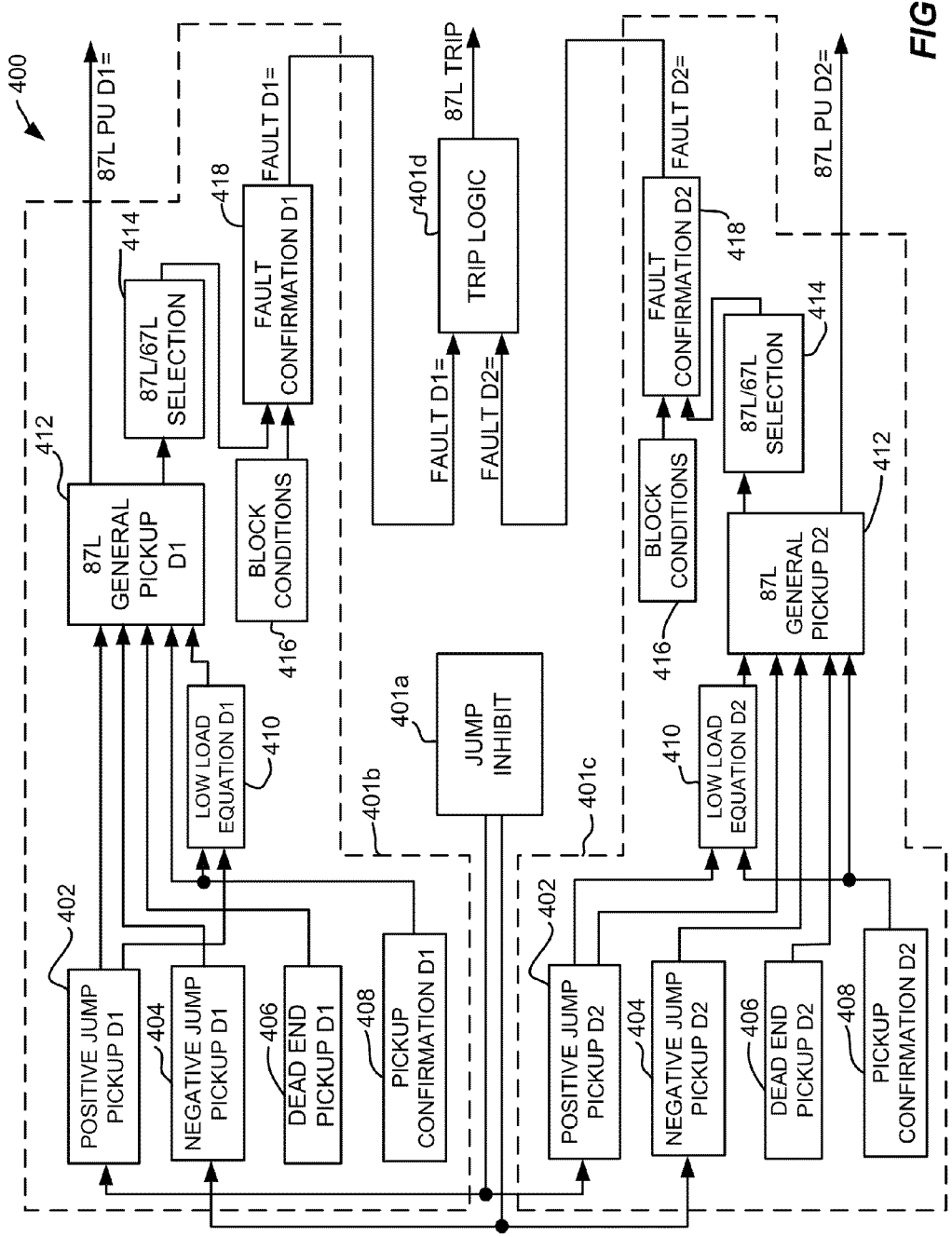
FIG. 4 is a schematic diagram of example protection logic for fault detection and protection in accordance with various embodiments.

FIG. 4 is a schematic diagram of example protection logic 400 for fault detection and protection in accordance with various embodiments. Protection logic 400 may be implemented, for example, in IED 200 (FIG. 2) and/or IEDs P1-P6 (FIG. 1) as hardware, software or a combination thereof as described. Protection logic 400 includes jump inhibit logic 401a, D1 protection logic 401b, D2 protection logic 401c and trip logic 401d. As described below, jump inhibit logic 401a reduces pickups from spurious faults or post fault switching. D1 protection logic 401b provides for fault detection in first direction D1 and D2 protection logic 401c provides for fault detection in a second direction D2. Trip logic 401d may generate a trip signal that causes a switching device to open in response to fault signals from protection logic 401b or 400c.

With reference to FIG. 4, protection logic 401b and 401c both include positive jump pickup logic 402, negative jump pickup logic 404, dead end pickup logic 406, pickup confirmation logic 408, low load equation logic 410, 87L general pickup logic 412, 87L/67L selection logic 414, block condition logic 416 and fault confirmation logic 418. D1 protection logic 401b generates a fault signal (FAULT D1=) if it detects a fault in direction D1, and D2 protection logic 401c generates a fault signal (FAULT D2=) if it detects a fault in direction D2. These fault signals are fed into trip logic 401d, which in turn may generate a trip signal (87L TRIP) that causes a switching device to open.

As stated, each IED in a feeder system may include protection logic 400 that includes jump inhibit logic 401a, D1/D2 protection logic 401b, 401c and trip logic 401d. For example, in FIG. 1, IEDs P1-P6 may each include such protection logic, which will allow each IED to open its respective switching device upon issuance of an 87L TRIP signal by the IED (e.g., breakers 106a-c and/or reclosers 108a-c).

In some embodiments, the protection logic 400 may perform the above-described six actions of a protection function as follows:

(1) Jump Detector Inhibit—if the protection logic 400 detects a positive jump in current, the jump inhibit logic 401a may block any subsequent negative jump in current; likewise, if the protection logic 400 detects a negative jump in current, the jump inhibit logic 401a may block any subsequent positive jump in current; the protection logic 400 also communicates any current jump to other IEDs connected to the same line section;

(2) 87L Pickup Communication—through positive jump pickup logic 402 and 87L general pickup logic 412, the protection logic 400 may issue an 87L pickup signal to other IEDs to communicate when its logical conditions are fulfilled for a fault in direction D1 or D2;

(3) 87L Pickup Confirmation—through pickup confirmation logic 408, the protection logic 400 may receive an 87L pickup signal from other IEDs when their logical conditions are fulfilled for a fault in direction D1 or D2;

(4) 87L Low Current Pickup Confirmation—through low load equation logic 410 (and/or pickup confirmation logic 408), if the protection logic of an IED does not detect a negative current jump due to light loading, an 87L pickup signal may still be generated in response to an incoming positive current jump signal from an IED so that lack of a negative current jump due to light loading does not prevent operation of the protective function;

(5) 87L Fault Detection Confirmation—through fault confirmation logic 418, if the protection logic 400 performs all relevant actions such that a fault is detected in direction D1 or D2, the fault may be confirmed from a ground and/or phase overcurrent measurement (e.g., to prevent a spurious fault or sudden change in load profile from initiating the protective function); and (6) Protection Trip—once the fault is detected and confirmed, trip logic 401d may allow the protection logic 400 to issue a trip command to isolate the faulted line section.

Example embodiments of the various logic 401a-418 are described below with reference to FIGS. 5-16. It will be understood that other logic functions may be employed to carry out one or more of actions 1-6 above.

Figure 5:
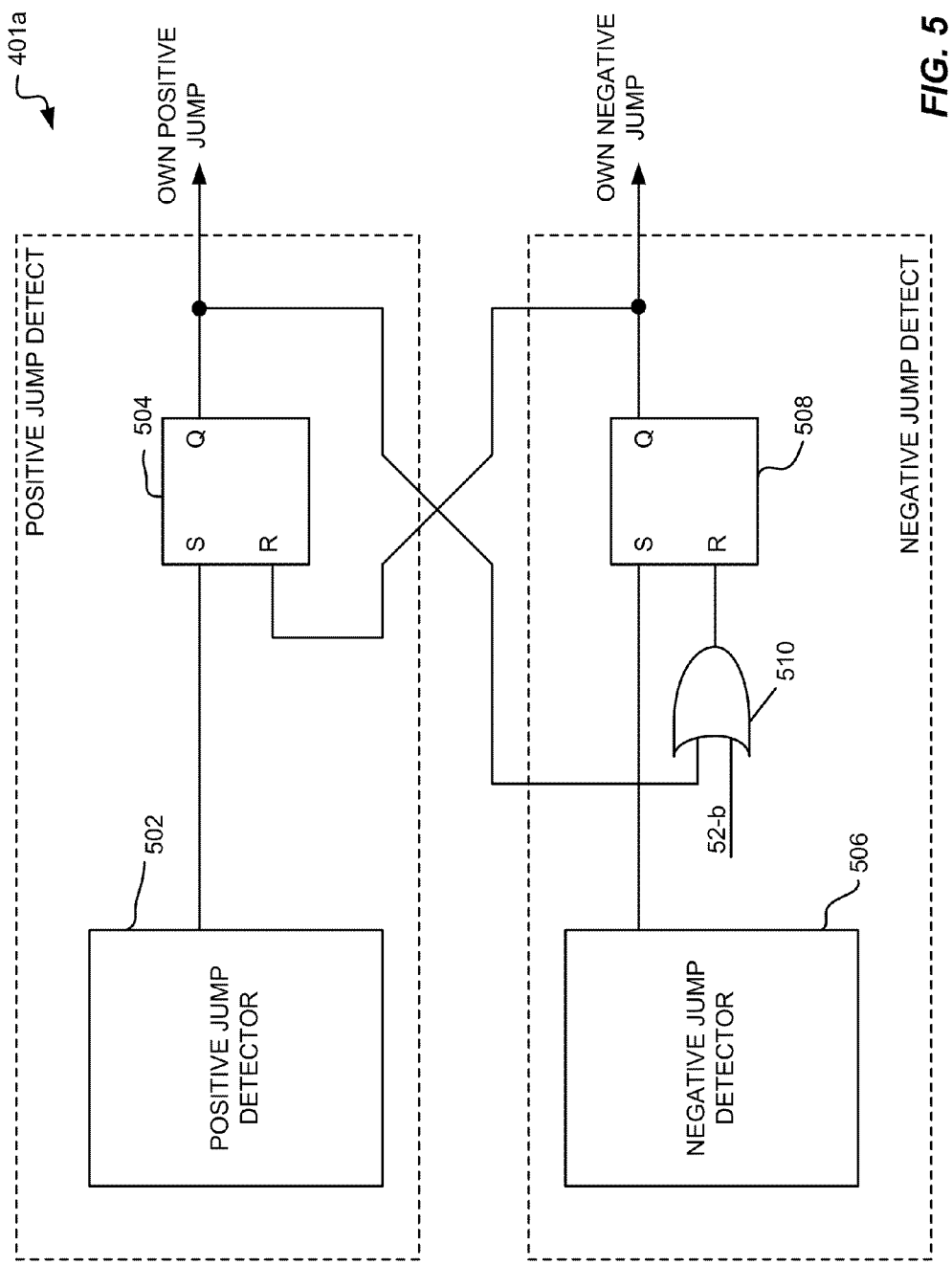
FIG. 5 is a schematic diagram of example jump inhibit logic provided in accordance with various embodiments.

FIG. 5 is a schematic diagram of example jump inhibit logic 401a provided in accordance with various embodiments. Jump inhibit logic 401a includes a positive jump detector 502 coupled to a first pulse timer 504, and negative jump detector 506 coupled to a second pulse timer 508. Positive jump detector 502 may be any current or other detector that generates a "positive jump" output signal when a measured current exceeds a predetermined threshold. For example, the positive jump detector 502 may be set to output a binary 0 value if a measured current on a line section remains below the predetermined threshold, and a binary 1 value if the measured current exceeds (jumps above) the predetermined threshold. Multiple thresholds may be employed in some embodiments. Any suitable predetermined threshold(s) may be used.

The negative jump detector 506 may be similarly configured, but generate a "negative jump" output signal when a measured current falls below a predetermined threshold. For example, the negative jump detector 506 may be set to output a binary 0 value if a measured current on a line section remains above the predetermined threshold, and a binary 1 value if the measured current drops (jumps) below the predetermined threshold. Multiple thresholds may be employed in some embodiments. Any suitable predetermined threshold(s) may be used.

The output of positive jump detector 502 serves as the start input of pulse timer 504, and the output of negative jump detector 504 serves as the start input of pulse timer 508. The output of pulse timer 504 may serve as the "own positive jump" signal for protection logic 400, while the output of pulse timer 508 may serve as the "own negative jump" signal for protection logic 400 (as described further below). The reset input of pulse timer 504 is coupled to the output of pulse timer 508, and the reset input of pulse timer 508 is coupled to the output of pulse timer 504 through an OR gate 510. A 52-b input may be employed to inhibit issuance of a negative jump signal if the IED's associated electrical component is opened.

In operation, if the positive jump detector 502 detects a positive jump in current, a positive jump signal is output which sets the output of pulse timer 504 to a high state (e.g., binary "1" for a predetermined time period). This provides an "own positive jump" signal to protection logic 400. The output of pulse timer 504 also resets pulse timer 508 and prevents pulse timer 508 from responding to any negative jump signal output from negative jump detector 506, at least while the output of pulse timer 504 remains high. Thus, an "own negative jump" cannot be generated while pulse timer 504 remains high. Likewise, a negative jump signal detected by negative jump detector 506 may prevent subsequent positive jump signals from generating an "own positive jump" signal while "own negative jump" is high.

In some embodiments, the pulse timers 504 and 508 output pulses having a pulse width of about 250 milliseconds, although larger or smaller pulse widths may be employed.

As described above, jump inhibit logic 401a may generate either an "own positive jump" or "own negative jump" signal in response to a positive jump or negative jump in current on a line section monitored by an IED. If positive jump detector 502 detects a positive jump in current, the jump inhibit logic 401a may block any subsequent negative jump in current from generating an "own negative jump" signal; likewise, if the negative jump detector 506 detects a negative jump in current, the jump inhibit logic 401a may block any subsequent positive jump in current from generating an "own positive jump" signal. This feature may limit any over operation of the protection logic 400 due to complex or evolving faults, switching sequences, evolving loads, or the like.

In some embodiments, the protection logic 400 may operate with low currents (e.g., about 3 pH), and voltage may not be required for the correct operation. To detect positive and negative current jumps, IEDs may use any existing algorithm. For example several overcurrent and undercurrent thresholds may be applied. When current exceeds any overcurrent threshold, an IED may issue an "Own Positive Jump=" signal. An "Own Negative Jump=" may be issued if current drops below any undercurrent threshold.

Another algorithm might be based on the periodic comparison of the presently measured RMS current value $I_m$ and a previously measured value $I_{m-1}$, sampled a few power cycles before (e.g., about 16-50 milliseconds). If the difference $\Delta I$ between two successive samples exceeds a threshold value $I_{jump}$, then the IED may detect a positive current jump.

A negative current jump may be detected if $\Delta I \leq -I_{jump}$. Mathematically this equation may be written as:

$$\begin{cases} \Delta I = I_m - I_{m-1} \geq I_{jump}, & \text{Own Position Jump} = 0 \to 1; \\ \Delta I = I_m - I_{m-1} \leq -I_{jump}, & \text{Own Negative Jump} = 0 \to 1. \end{cases}$$

FIG. 6A is a schematic diagram of example positive jump pickup logic 402 for direction D1 provided in accordance with various embodiments. Positive jump pick logic 402, and the other logic described below, are described with reference to pickups in direction D1 from up to four IED devices. It will be understood similarly configured logic may be employed for pickups in direction D2 and/or from fewer or more IED devices. For example, FIG. 6B is a schematic diagram of example positive jump pickup logic 402 for direction D2 in accordance with various embodiments.

With reference to FIG. 6A, in response to a positive current jump on a line section, positive jump pickup logic 402 receives an "Own Pos Jump=" signal from jump inhibit logic 401a (FIG. 4 and FIG. 5). The "Own Pos Jump=" signal is fed to an AND gate 5. The positive jump signal is also communicated to all other IEDs in the D1 direction, which in response thereto, issue negative jump signals, or 52-b status signals, received by positive jump pickup logic 402 (FIG. 6). As shown in FIG. 6, positive jump pickup logic 402 may receive either negative jump signals or 52-b status signals from up to four devices D11-D14 (where the tens digit indicates direction and the units digit indicates device number as previously described). A 52-b status signal is issued when an IED's primary switching device, such as a recloser or breaker, is open.

The negative jump signals ("Neg Jump D11", "Neg Jump D12", etc.) and 52-b Status signals from IEDs connected to the line section in direction D1 drive OR gates 1-4, the outputs of which are fed to AND gate 5 along with "Own Pos Jump=". If a negative jump signal or high 52-b Status signal is received from each IED connected to the line section in direction D1, AND gate 5 outputs a high logic state to 87L General pickup logic 412 (FIG. 10A) that drives OR gate 13 to generate an "87L PU D1=" signal. If there are fewer than four IEDs connected to the line section in direction D1, the inputs "52-b Status of D12>", "52-b Status of D13>", or "52-b Status of D14>" for the missing IED(s) may be replaced with a logical "1" (high voltage state). Failure of any IED connected to the line section to communicate a negative jump signal or 52-b status signal disables the output of AND gate 5.

FIG. 7A is a schematic diagram of example negative jump pickup logic 404 for direction D1 provided in accordance with various embodiments. (Example negative jump pickup logic 404 for direction D2 is shown in FIG. 7B.) With reference to FIG. 7A, in response to a negative current jump on a line section, negative jump pickup logic 404 receives an "Own Neg Jump=" signal from jump inhibit logic 401a (FIG. 4 and FIG. 5). The "Own Neg Jump=" signal is fed to OR gate 6 along with inverted "Own Pos Jump=". If the "Own Neg Jump=" signal is high and/or no positive current jump is detected, OR gate 6 outputs a high logic state to AND gate 8. Additionally, if at least one positive current jump signal ("Pos Jump D11", "Pos Jump D12", etc.) is received from an IED connected to the line section in direction D1, OR gate 7 outputs a high logic state.

As stated, AND gate 8 outputs a high logic state when (1) an IED detects is a negative current jump or, due to light loading, detects only the absence of a positive current jump; and (2) at least one positive current jump is detected by an IED connected to the line section in direction D1. A high logic state from AND gate 8 is fed to 87L General pickup logic 412 (FIG. 10A) and drives OR gate 13 to generate an "87L PU D1=" signal.

Figure 8B:
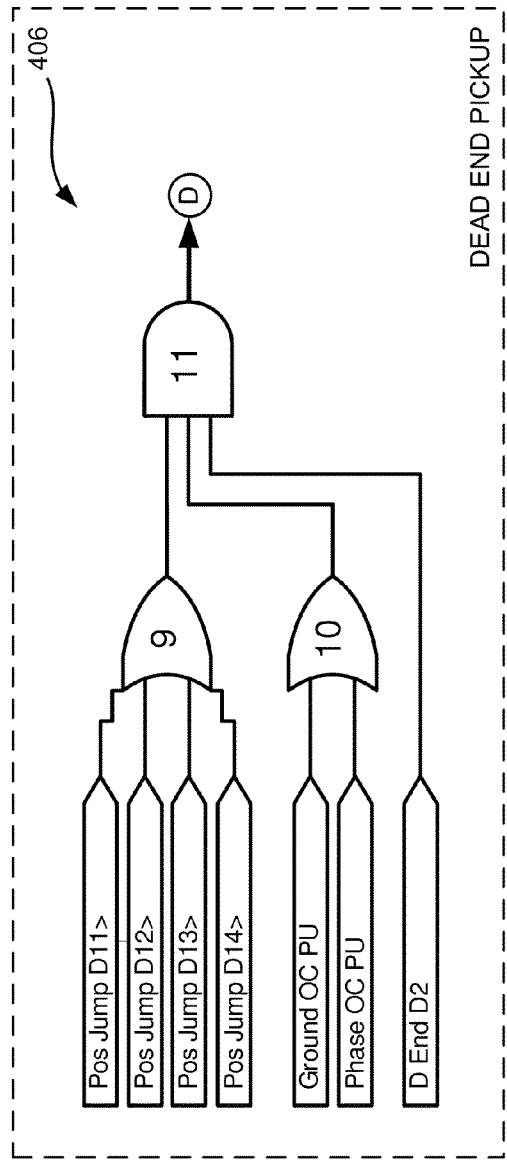

If an IED is the only IED connected along direction D1 or D2, fault detection and isolation are performed without information from that direction; and fault detection may be performed employing dead end pickup logic 406 (FIGS. 8A-8B).

FIG. 8A is a schematic diagram of example dead end pickup logic 406 for direction D1 provided in accordance with various embodiments. (Example dead end pickup logic 406 for direction D2 is shown in FIG. 8B.) Dead end pickup logic 406 is activated by setting "D End D1" to a high logic state if an IED is not connected to any other IED in direction D1. OR Gate 10 receives ground overcurrent (OC) pickup and phase OC pickup signals from ground and phase overcurrent elements (not shown) which measure ground current magnitude and phase at the line section to which the IED is connected. These current elements are employed to confirm fault detection. Thresholds for overcurrent may be set, for example, above maximum possible load current. In some embodiments, a ground OC element measures neutral or zero sequence current and issues a "Ground OC PU" signal if ground current exceeds a predetermined threshold. A phase OC element may operate similarly with phase currents, and issue a "Phase OC PU" if phase current exceeds a predetermined threshold. In some embodiments, operation of dead pickup logic 406 may be delayed by introducing a delay to the ground and phase OC elements to coordinate with possible downstream devices.

In operation, dead end pickup logic 406 is activated by applying a high logic state to tag "D End D1". Thereafter, if a positive current jump has been detected by any IED in direction D2 so that OR gate 9's output is high, and either a ground or phase overcurrent condition has been detected so that OR gate 10's output is high, AND Gate 11 activates and issues a logical "1" or high voltage state that is fed to 87L general pickup logic 412 (FIG. 10A) to allow fault detection and confirmation as described further below.

In some embodiments, an IED reliably detects a fault in a line section direction D1 or D2, when the IED receives 87L pickup signals from all the other IEDs connected to the line section in that direction (e.g., all devices agree with the fault location). If any 87L pickup signal is missing from any IED device connected to the line section in the direction of interest, either the logical equation in that IED is not fulfilled or the communication network has been failed. In such cases, a fault will not be located and protection will not trip to avoid any over operation. Pickup confirmation logic 408 determines wither a pickup signal has been received from all relevant IEDs.

Figure 9B:
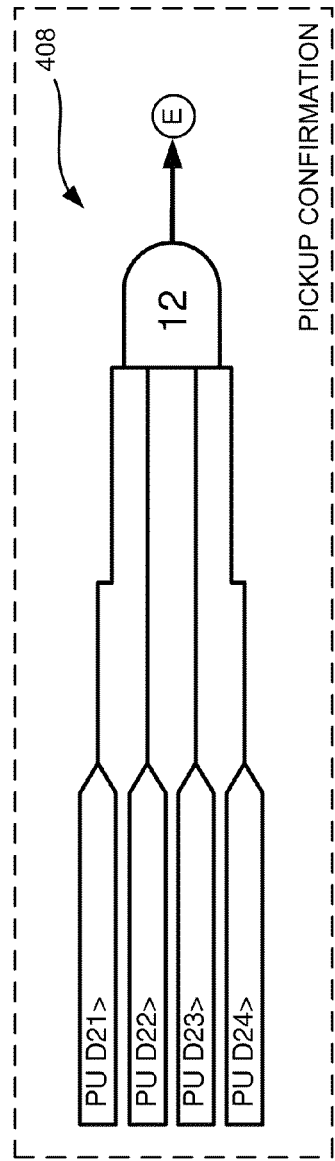

FIG. 9A is a schematic diagram of example pickup confirmation logic 408 for direction D1 in accordance with various embodiments. (Example pickup confirmation logic 408 for direction D2 is shown in FIG. 9B.) Within the pickup confirmation logic 408, the 87L Pickup signals from all IEDs connected to the line section along direction D1 are fed to AND Gate 12. AND gate 12 outputs a high logic state if all IEDs have issued a pickup signal. The high voltage state is fed to 87L general pickup logic 412 (FIG. 10A) to allow fault detection and confirmation as described further below. Note that if less than four IEDs are connected along direction D1 relative to an IED, the remaining/unused pickup inputs to the AND Gate 12 may be replaced by the logical "1" or high voltage state.

In lightly loaded line sections or other instances, an IED may not detect a negative jump current. However, in some embodiments, an IED located downstream from a fault may receive positive jump information from an upstream device (as this information is communicated to the IED from the upstream IED) and may employ negative pickup logic 404 to issue an echo signal, informing the upstream IED that communication with the IEDs is operational, but due to lack of the information, the downstream IED did not detect the fault (as no negative current jump was observed). For example, the tag of the upstream IED used for the 87L Pickup signal may be employed for the echo signal. OR gate 6 of negative jump pickup logic 404 (FIG. 7A) may issue a high voltage to AND gate 8 even if a negative current jump is not detected (assuming a positive current jump is also not present). In the upstream IED, low load equation logic 410 (FIG. 10A) employs AND Gate 16 to fulfill the low load equation if the upstream IED's own positive jump has been detected and the upstream IED received all the pickup and/or echo signals from other IEDs in direction D1. Note that absent low load equation logic 410, no 87L pickup signal would be generated by the upstream IED if one or more downstream IEDs failed to detect a negative current jump. For example, assuming the 52-b Status lines are low, one missing negative jump signal ("Neg Jump D11", "Neg Jump D12", etc.) would cause AND gate 5 (FIG. 6A) of positive jump pickup logic 402 to output a low signal. As no negative current jump would be detected following the positive jump in the upstream IED, the output of OR gate 13 (FIG. 10A) would be low and no 87L pickup signal or fault trigger could be generated. Low load equation 410 addresses such circumstances.

Figure 10A:
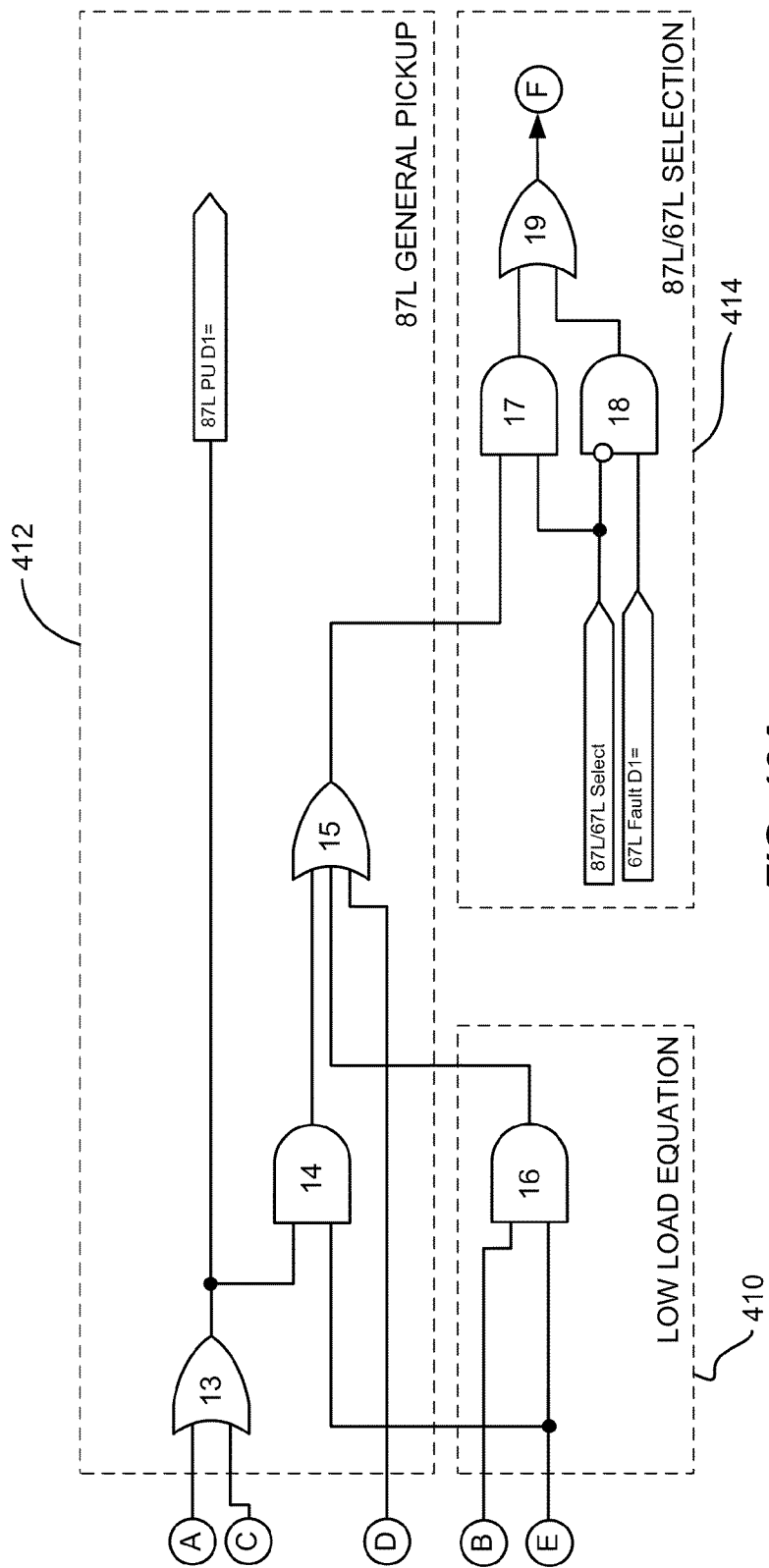
FIGS. 10A-10B are schematic diagrams of example low load equation logic, 87L general pickup logic and 87L/67L selection logic provided in accordance with various embodiments.
Figure 10B:
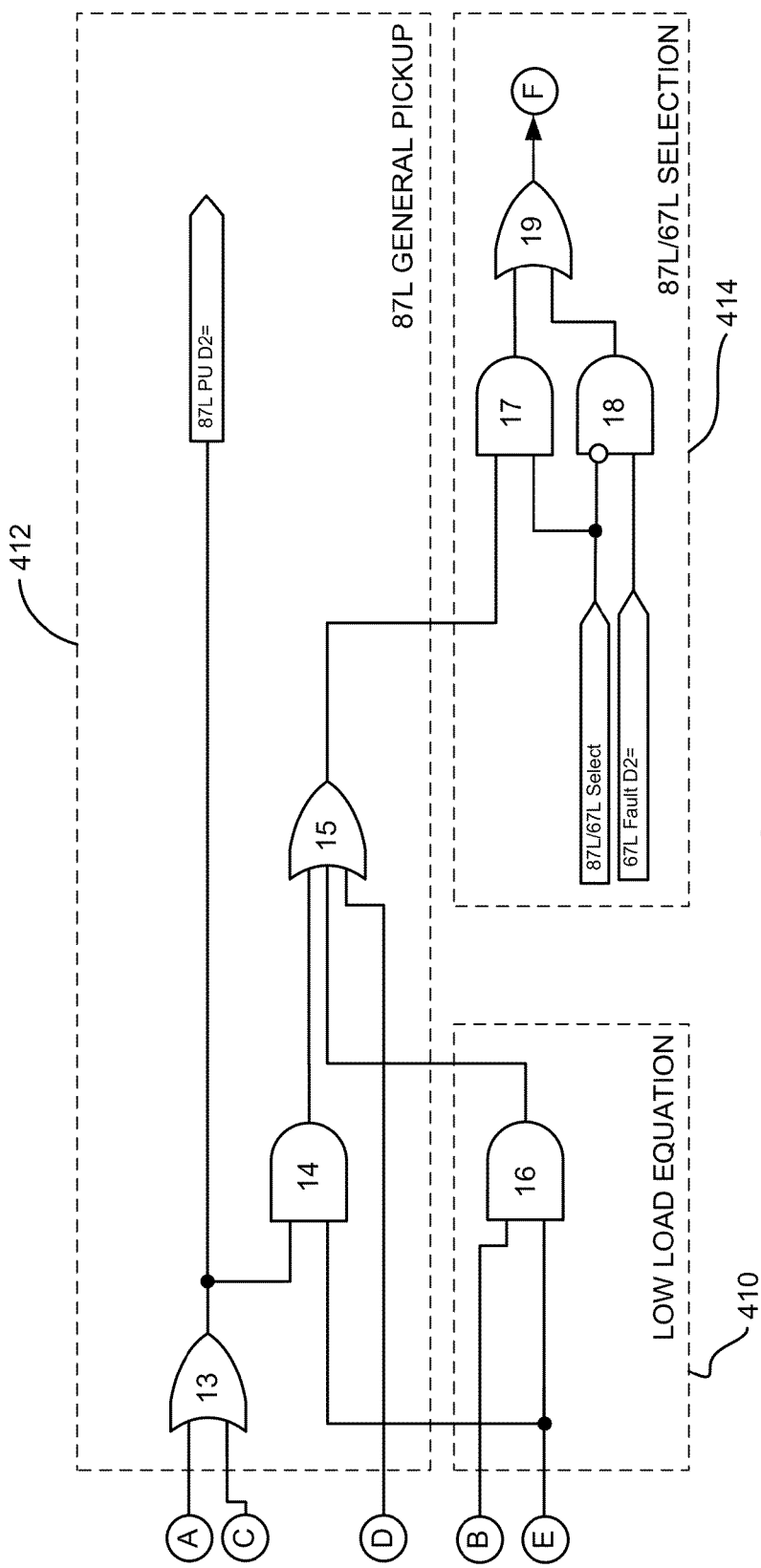

FIG. 10A is a schematic diagram of example low load equation logic 410, 87L general pickup logic 412 and 87L/67L selection logic 414 in direction D1 provided in accordance with various embodiments. (Example direction D2 logic for these functions is shown in FIG. 10B.) As shown in FIG. 10A, 87L general pickup logic 412 receives inputs from AND gate 5 of positive jump pickup logic 402 (FIG. 6A), AND gate 8 of negative jump pickup logic 404 (FIG. 7A), AND gate 11 of dead end pickup logic 406 (FIG. 8A), AND gate 12 of pickup confirmation logic 408 (FIG. 9A) and AND gate 16 of low load equation logic 410.

87L General Pickup logic 412 issues an "87L PU D1=" signal to the other IEDs in the direction D1 when logical equations are fulfilled for positive jump pickup logic 402 or negative jump pickup logic 404. When all other IEDs in the direction D1 confirm the pickup (e.g., issue an 87L pickup signal) through pickup confirmation logic 408, or if the logic equation fulfills for dead end pickup logic 406 or if the low load equation 410 fulfills, OR Gate 15 drives AND gate 17 of 87L/67L selection logic 414.

Figure 11A:
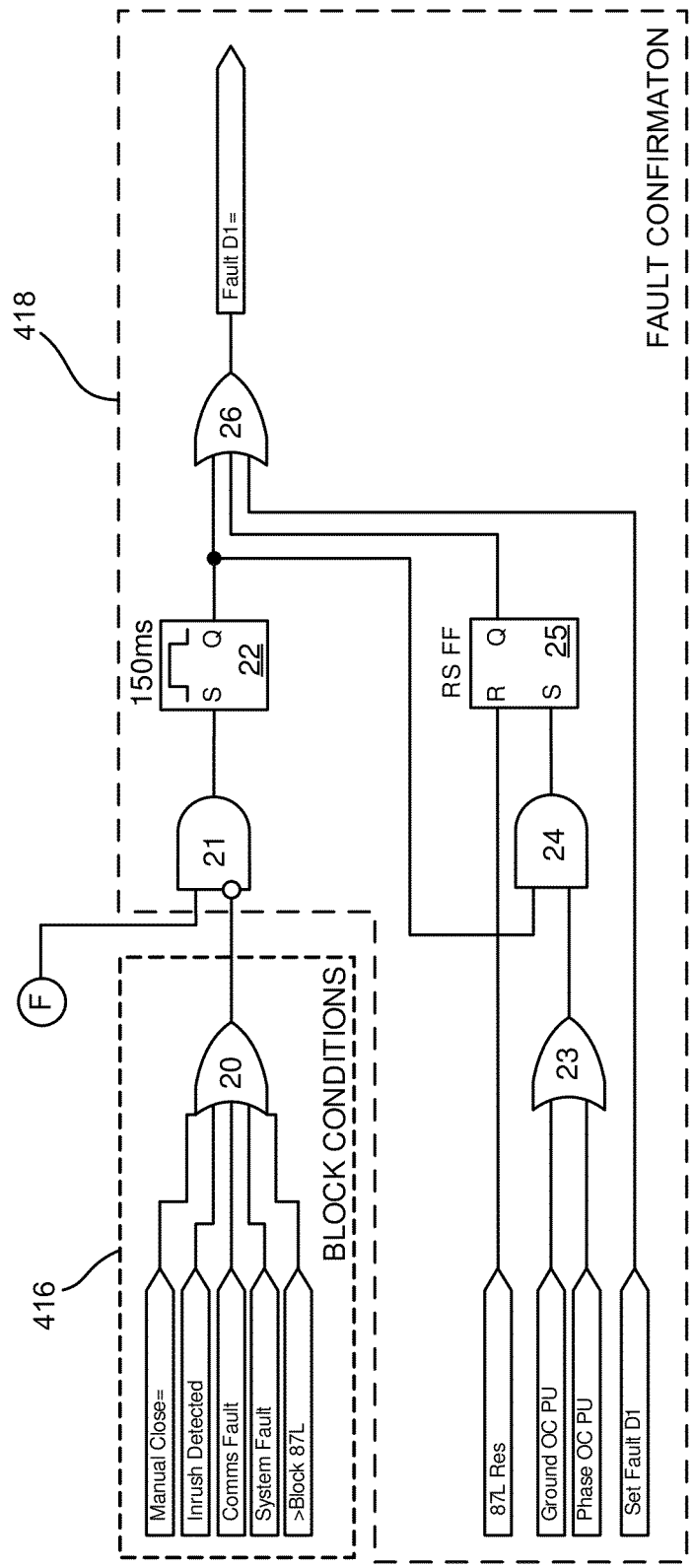
FIGS. 11A-11B are schematic diagrams of example fault confirmation logic in accordance with various embodiments.

87L/67L selection logic 414 is designed to switch between the protective function described herein ("87L") and another fault detection algorithm, such as use of directional overcurrent elements or any other fault detection algorithm. 87L may be selected by setting "87L/67L Select" high so that AND gate 17 and OR gate 19 of 87L/67L selection logic 414 pass the output of OR gate 15 of 87L general pickup logic 412 to fault confirmation logic 418 (FIG. 11A). Alternatively, to select another fault detection algorithm (referred to as "67L"), 87L/67L select may be set low, disabling the output of OR gate 15 of 87L general pickup logic 412 and passing the fault detection signal from another detection algorithm ("67L Fault D1=") to fault confirmation logic 418 through AND gate 18 and OR gate 19 of 87L/67L selection logic 414.

Figure 11B:
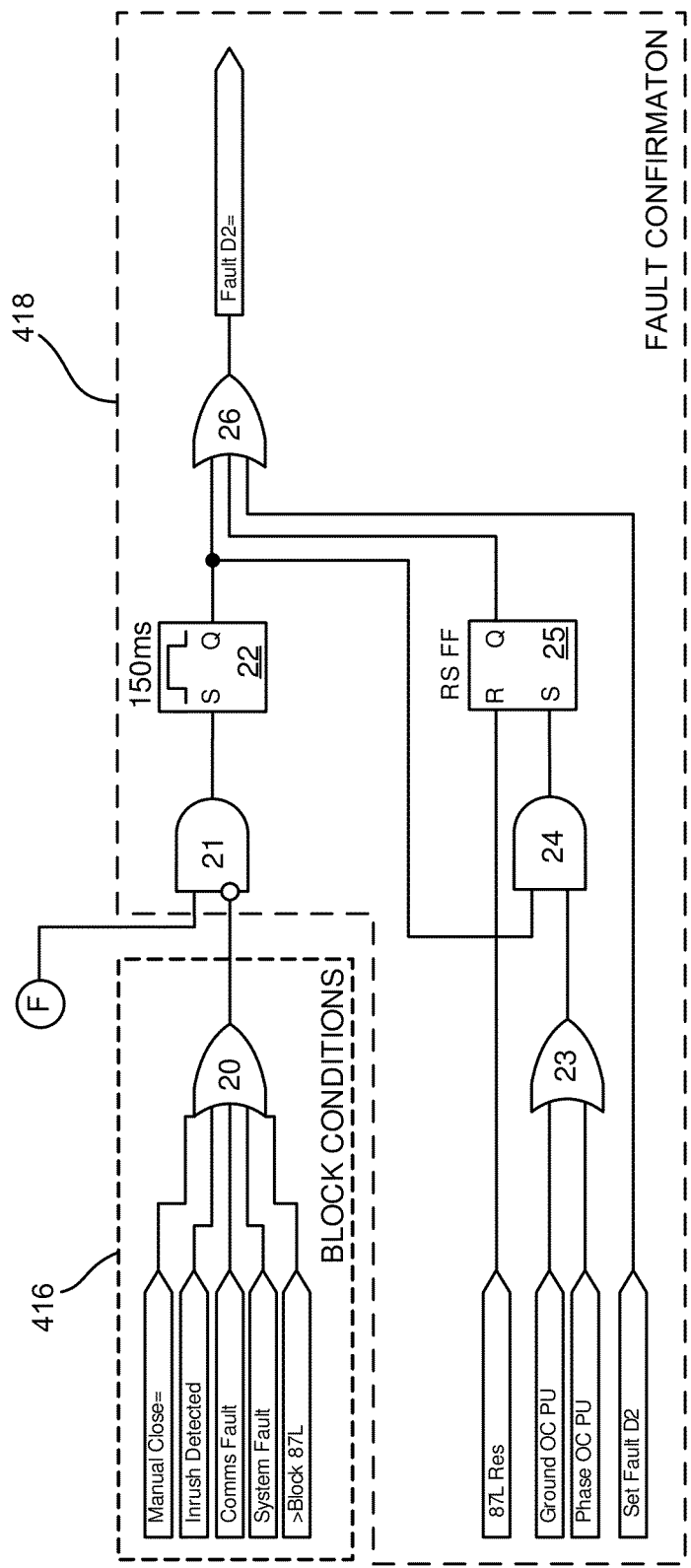

As stated, with 87L selected in 87L/67L selection logic 414, the fault detection signal from OR gate 15 of 87L general pickup logic 412 is fed to fault confirmation logic 418 of FIG. 11A, which illustrates a schematic diagram of example fault confirmation logic 418 in direction D1 in accordance with various embodiments. (Example fault confirmation logic 418 for direction D2 is shown in FIG. 11B.) As shown in FIG. 11A, the output of OR gate 15 of 87L general pickup logic 412 (FIG. 10A) drives a first input of AND gate 21 (FIG. 11A) of fault confirmation logic 418. The second input of AND gate 21 is driven by a block condition signal from block condition logic 416. If no block conditions exist, AND Gate 21 drives Timer 22 in the fault confirmation logic 418.

In some embodiments, 87L protection may be disabled manually or automatically whenever a Manual Close signal, Inrush signal, Communication (Comms) Fault signal, System Fault signal, or >Block 87L signal is received by block conditions logic 416. These blocking conditions/signals are described below in Table 2. If any block signal is active, OR gate 20 of block condition logic 416 drives the output of AND gate 21 of fault confirmation logic 418 low, disabling fault confirmation.

TABLE 2

| | |
|---|---|
| Manual Close = | Manual Close signal may be a 500 ms pulse or other suitable pulse width, issued when a primary switching device has been closed. |
| Inrush Detected | Inrush signal is active if a significant inrush current is detected due to energizing of a transformer on the feeder. |
| Comms Fault | Comms Fault signal is active if an IED lost communication to any other IED in the system. |
| System Fault | System fault signal is active if the protection logic (87L) already detected a fault on the feeder. |
| >Block 87L | By this tag 87L protection may be blocked by a control center or due to any other condition. |

If no block conditions exist, and the 87L general pickup logic 412 indicates a fault has been detected, AND Gate 21 of fault confirmation logic 418 drives timer 22. When this timer is initiated, fault confirmation is performed (e.g., OR gate 26 issues fault signal "Fault D1=" informing all IEDs connected to the line section that a fault has been detected in direction D1.)

To ensure that the detected fault is not a spurious fault or detection of sudden change in the load profile, the detected fault is confirmed from a ground overcurrent (OC) pickup signal or phase OC pickup signal from ground and phase OC elements (not shown) which measure ground current magnitude and phase at the line section to which the IED is connected. Thresholds for overcurrent may be set, for example, above maximum possible load current. In some embodiments, a ground OC element measures neutral or zero sequence current and issues a "Ground OC PU" signal if ground current exceeds a predetermined threshold. A phase OC element may operate similarly with phase currents, and issue a "Phase OC PU" if phase current exceeds a predetermined threshold. In some embodiments, current OC elements must pickup while timer 22 is running (as described below).

If Ground OC PU or Phase OC PU signals are present, OR Gate 23 sets the flip flop 25 through AND Gate 24 (assuming the output of timer 22 is high). Once flip flop 25 has been set, output Q becomes high (binary "1"), and OR Gate 26 issues a fault signal "Fault D1=" (confirmed fault detected in direction D1). The fault is latched by flip flop 25 until flip flop 25 is reset (e.g., flip flop 25 keeps "Fault D1=" high even if timer 22 times out). Flip flop 25 can be reset by the tag "87L Res" locally at the IED or remotely from a control center, for example. In some embodiments, OR Gate 26 also may issue the "Fault D1=" signal if binary tag "Set Fault D1" is activated to simulate fault detection during the testing of the system.

Once a fault is detected and confirmed, the protection logic 400 issues a trip command to isolate the faulted line section. In some embodiments, the trip command may be issued only once. For example, if several auto reclose attempts are made, further trip commands may be issued by overcurrent protection logic (not shown).

Figure 12:
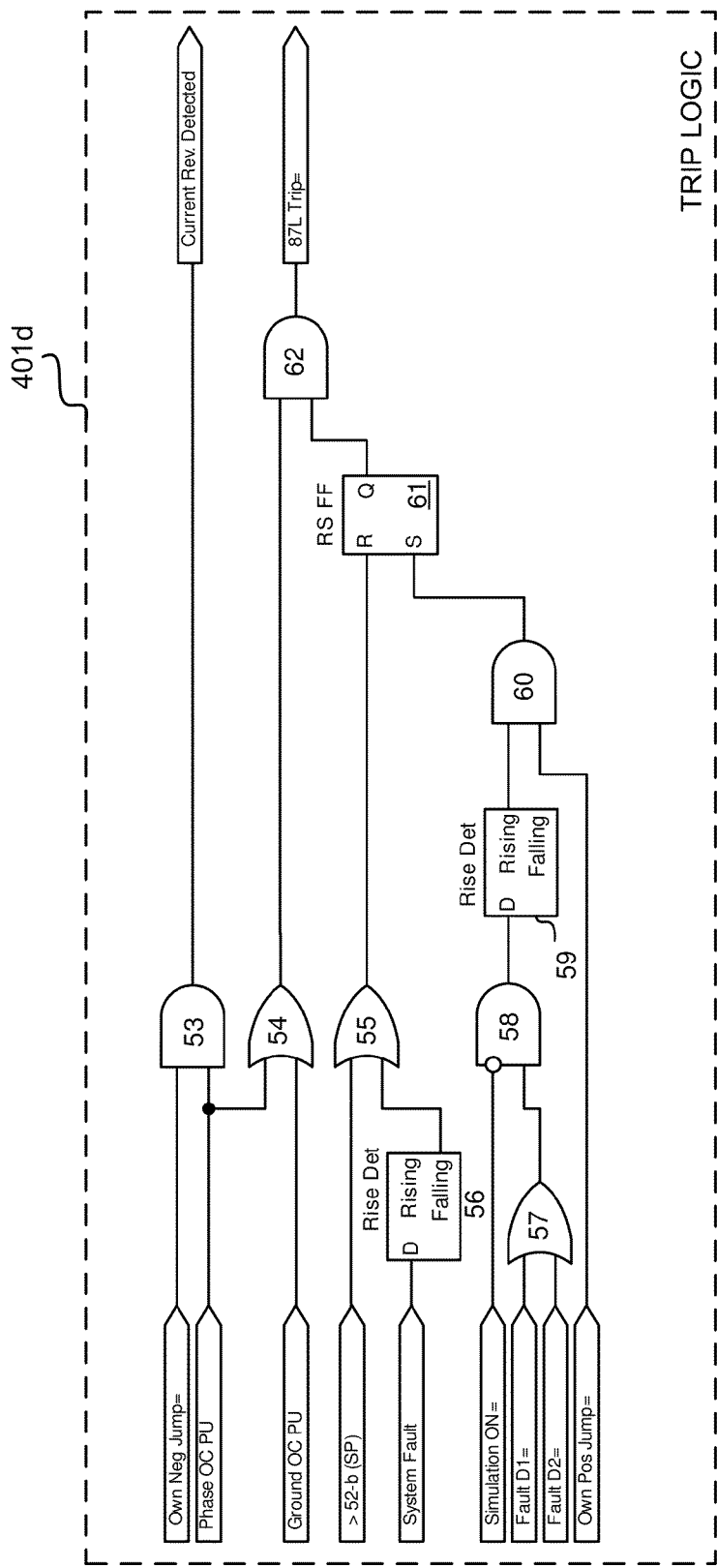
FIG. 12 is a schematic diagram of example trip logic in accordance with various embodiments.

FIG. 12 is a schematic diagram of example trip logic 401d in accordance with various embodiments. After a fault signal is detected, such as Fault D1=from OR gate 26 (FIG. 11A) of fault confirmation logic 418 or a similar Fault D2= signal (FIG. 11B) in the D2 direction, OR gate 57 (FIG. 12) drives AND gate 58. Assuming the system is not in a simulation mode (e.g., "Simulation ON=" is low so that simulation mode is disabled), AND gate 58 sends a logical high signal to the input D of rise detector 59. With a positive jump current having been detected and given rise to the Fault D1= or Fault D2= signal, rise detector 59 then drives AND gate 60, which sets flip flop 61. If either ground or phase overcurrent elements detect/confirm ground or phase overcurrents (as identified through OR gate 54), the set flip flop 61 will cause AND gate 62 to output a high logic state, which serves as the trip command "87L Trip=". This causes the primary switching device associated with the IED to open. Once the primary switching device has been opened, ">52-b" status feedback input is set high (true), which resets the flip flop 61 through OR gate 55. (Note that if a system fault is not present anymore, rise detector 56 may drive OR gate 55 to reset flip flop 61 and disable issuance of trip commands.)

An overcurrent is associated with a positive jump in current. In some embodiments, if both an overcurrent and negative current jump are detected, a current reversal (rev.) is declared by issuance of "Current Rev. Detected" by AND gate 53. This may occur if there an active load such as a motor connected to a line section. The motor may act as generator or source and feed a fault for a short time period, for example.

The trip command issued by trip logic 401d causes primary switching equipment, such as a circuit breaker or recloser, coupled to an IED to open as shown, for example, in FIG. 2. In this manner, the faulted line section is isolated.

Note that protection logic 401c for direction D2 is essentially identical to protection logic 401b for direction D1, with the exception that tags labeled D1 are replaced with tags labeled D2, and tags labeled with D11, D12, D13 and D14 are replaced with tags labeled D21, D22, D23, and D24, respectively. Tags labeled D21, D22, D23 and D23, such as in dead end pickup logic 406 (FIG. 8A) are replaced with tags labeled D11, D12, D13 and D14, respectively. This may be seen in FIGS. 6B, 7B, 8B, 9B, 10B and 11B.

Example Operation of Protection Logic

Figure 13:
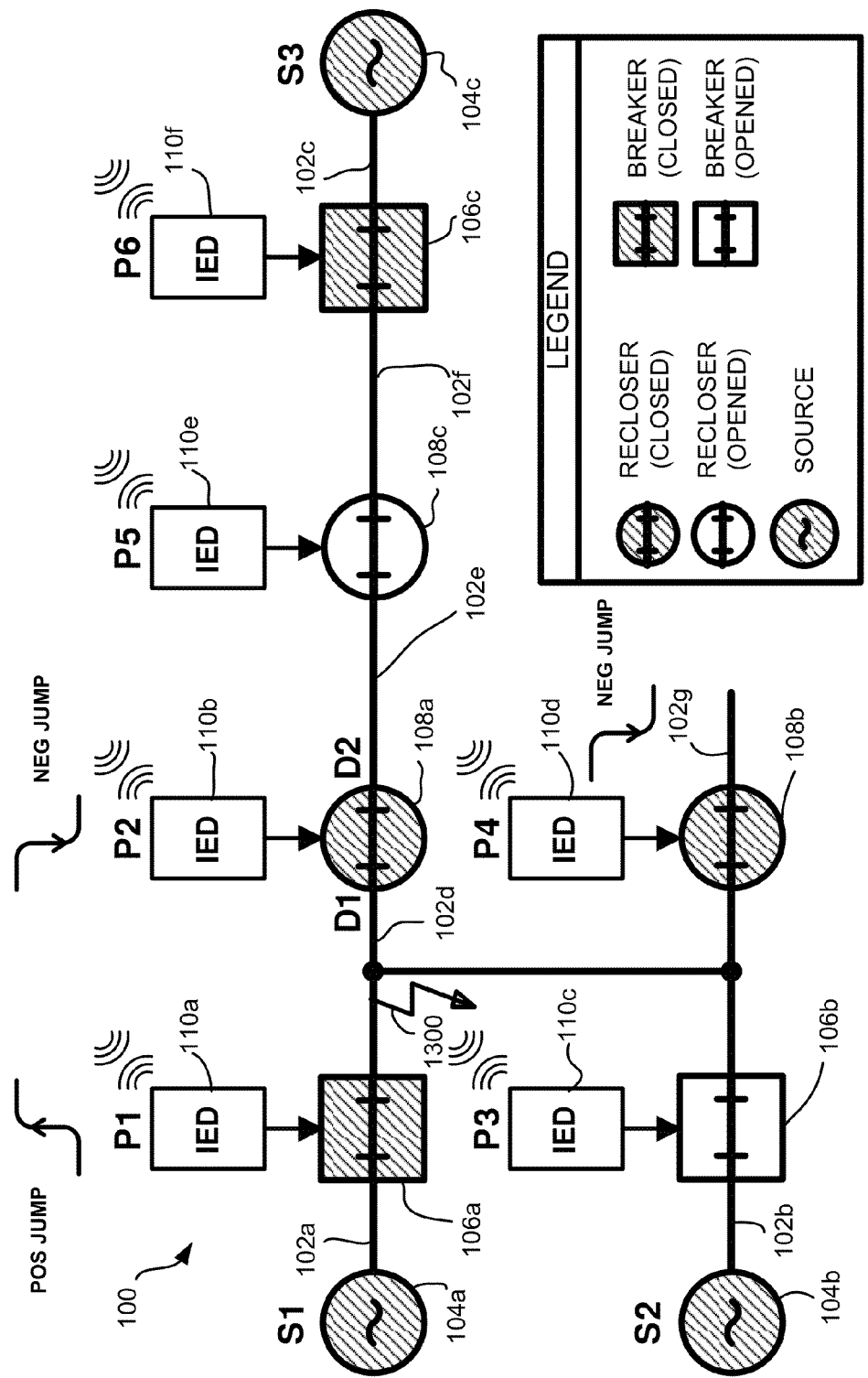
FIG. 13 is a schematic diagram of a first example of a faulted mesh-connected distribution feeder provided in accordance with various embodiments.

Example operation of the protection logic 400 is described below with reference to FIG. 13, which is identical to FIG. 1 but with a fault 1300 on line section 102d. In this case, IED P1 sees a sudden current increase and issues an "Own Positive Jump=" signal (Action 2) to all other IEDs connected to line section 102d (IEDs P2, P3 and P4). IEDs P2 and P4 both see a sudden decrease of current and issue their "Own Negative Jump=" signals. Inhibit jump logic 401a prevents each IED from issuing multiple current jump signals (Action 1). IED P3 is open and does not observe any current jump.

IED P2 detects a negative jump in current. In response to a positive jump signal from IED P1 (Pos Jump D11> in FIG. 7A), negative jump pickup logic 404 (FIG. 7A) within IED P2 drives OR gate 13 (FIG. 10A) of 87L general pickup logic 412. This causes IED P2 to issue an "87L PU D1=" pickup signal (Action 2) to all IEDs connected in direction D1 (IEDs P1, P3, and P4). (Missing inputs may be tied to a high logical voltage "1".)

IED P4 detects a negative jump in current. Logic behavior in the IED P4 is similar to that of IED P2. In response to a positive jump signal from IED P1 (Pos Jump D11>), negative jump pickup logic 404 within IED P4 drives OR Gate 13 (FIG. 10A). P4 issues an "87L PU D1=" pickup signal (Action 2) to all IEDs (IEDs P1, P3, and P2) connected in the direction D1.

IED P3 is open, and does not observe any current jumps. Nevertheless IED P3 receives the positive jump signal "Pos Jump D21>" signal from IED P1 (FIG. 7B) and replies by sending pickup signal "87L PU D2=" (Action 2). This echo signal is employed to check validity of the communication network during the fault detection period. Negative jump pickup logic 404 for direction D2 would perform this function because OR gate 6 (FIG. 7B) has an inverted input connected to the "Own Positive Jump=" signal. If IED P3 detected a positive current jump, an echo signal would not be sent along direction D2 by IED P3.

IED P1 receives the negative jump signals "Neg Jump D22>", "Neg Jump D24>" from IEDs P2 and P4, respectively. Within positive jump pickup logic 402 of IED P1, OR gates 2 and 4 (FIG. 6B) receive these inputs and output a high logic voltage. IED P3 provides its open status "52-b Status of D23" to the OR Gate 3 instead of a negative jump signal. Missing links to the OR gate 1 are replaced by logical "1". As all conditions for the AND Gate 5 are true, OR gate 13 (FIG. 10B) issues an 87L PU D2= pickup signal to all the IEDs in the direction D2 (Action 2).

IED P1 receives 87L pickup signals from IEDs P2, P3 and P4, which indicate these devices agree with the fault location on the line section 102d. Within IED P1, AND gate 12 (FIG. 9B) of pickup confirmation logic 408 drives OR gate 15 (FIG. 10B) of 87L general pickup logic 412 through AND gates 14 and 16 (Action 3). OR gate 15 makes AND gate 21 (FIG. 11B) active, if block conditions are not present at this moment. AND gate 21 drives the pulse timer 22. Once timer has been started, AND gate 24 waits for the Ground or Phase overcurrent elements to confirm the fault. These elements might have some definite time delay to avoid overreaction due to spurious faults or lightning strikes. (Action 4 is not fulfilled because all negative current jumps or 52-b signals were received.)

If the fault is confirmed within the delay set by flip flop 22 (e.g., 150 milliseconds or another suitable delay), AND gate 24 sets the flip flop 25. As such, the fault is reliably detected and a fault event is latched by IED P1. OR gate 26 provides a "Fault D2=" signal for the internal logic and control center (Action 5).

With reference to FIG. 12, OR gate 57 through AND gate 58 drives the rise detector 59 in response to the Fault D2= signal. The pulse from the rising output of rise detector 59 sets flip flop 61 through AND gate 60. Assuming a phase OC signal has been picked up, flip flop 61 sends the trip command "87L Trip" through AND gate 62 to open circuit breaker 106a (FIG. 13). When the switching device associated with IED P1 has been opened (e.g., when circuit breaker 106a has opened), a ">52-b" status feedback input becomes high and resets flip flop 61 through OR gate 55. With circuit breaker 106a opened, faulted section 102d is isolated from the source 104a (Source S1).

Protection logic 400 in IEDs P2, P3, and P4 also detects the fault on line section 102d. However, a trip command is issued only by device P1 because the trip logic operates only if a positive jump is detected, allowing AND Gate 60 (FIG. 12) to set flip flop 61.

Lightly Loaded Operation of Protection Logic

Figure 14:
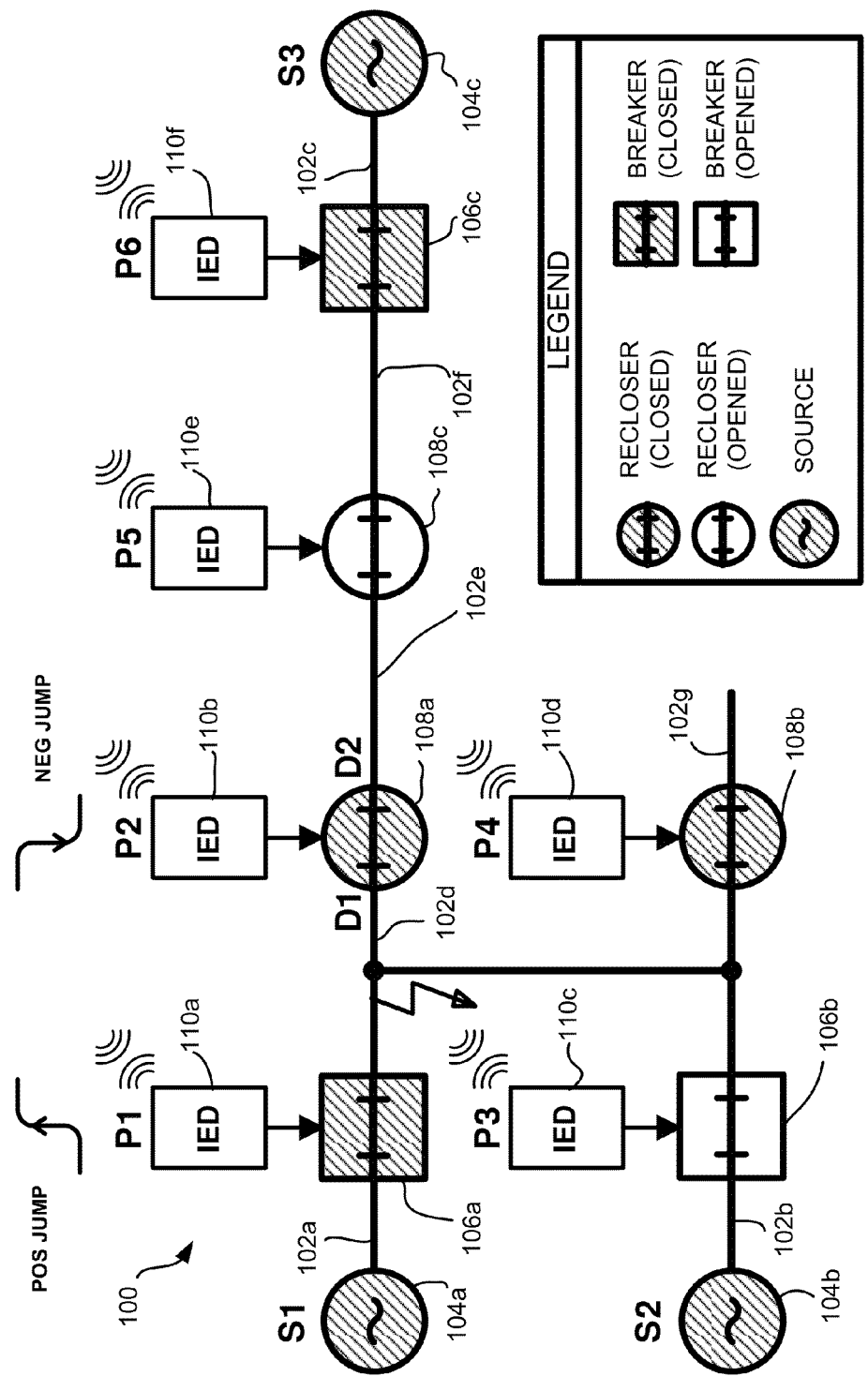
FIG. 14 is a schematic diagram of a second example of a faulted mesh-connected distribution feeder provided in accordance with various embodiments.

Consider the protection behavior in case of a fault in line section 102d when line section 102g is lightly loaded and IED P4 does not a negative jump in current (FIG. 14). In this case, IED P1 sees a sudden increase of the current and issues an "Own Positive Jump=" signal. IED P2 sees a sudden current drop in the faulted phases and issues an "Own Negative Jump=" signal. IED P3 is open and therefore does not detect any current jump.

Logic behavior for IEDs P2 and P3 is the same as described above. IED P4 receives a positive jump signal from IED P1, but detects no positive or negative jump signal of its own. Nevertheless, IED P4 sends an echo pickup signal "87L PU D1=" back in the direction D1 (because no positive jump is detected so OR gate 6 (FIG. 7A) becomes active along with OR gate 7 to drive AND gate 8 and OR gate 13 (FIG. 10A).

IED P1 receives the negative jump signal "Neg Jump D22>" signal from IED P2 (FIG. 6B), but no negative jump from IED P4. Therefore OR gate 4 and AND gate 5 are inactive. Nevertheless IED P1 receives a "PU D22>" pickup signal (FIG. 9B) from IED P2 and echo signals "PU D23>", "PU D24>" from IED P3 and P4 respectively, so AND gate 12 becomes active and drives the OR gate 15 through AND gate 16. IED P1 then operates as it is described above.

AND Gate 16 is designed to trigger the protection logic in cases in which a device fails to receive all negative jumps from other IEDs due to a low load condition. In such cases the local protection logic may be triggered if at least all the pickups or echo signals has been received from the other IEDs.

Detection of Positive Jump by Multiple IEDs

Figure 15:
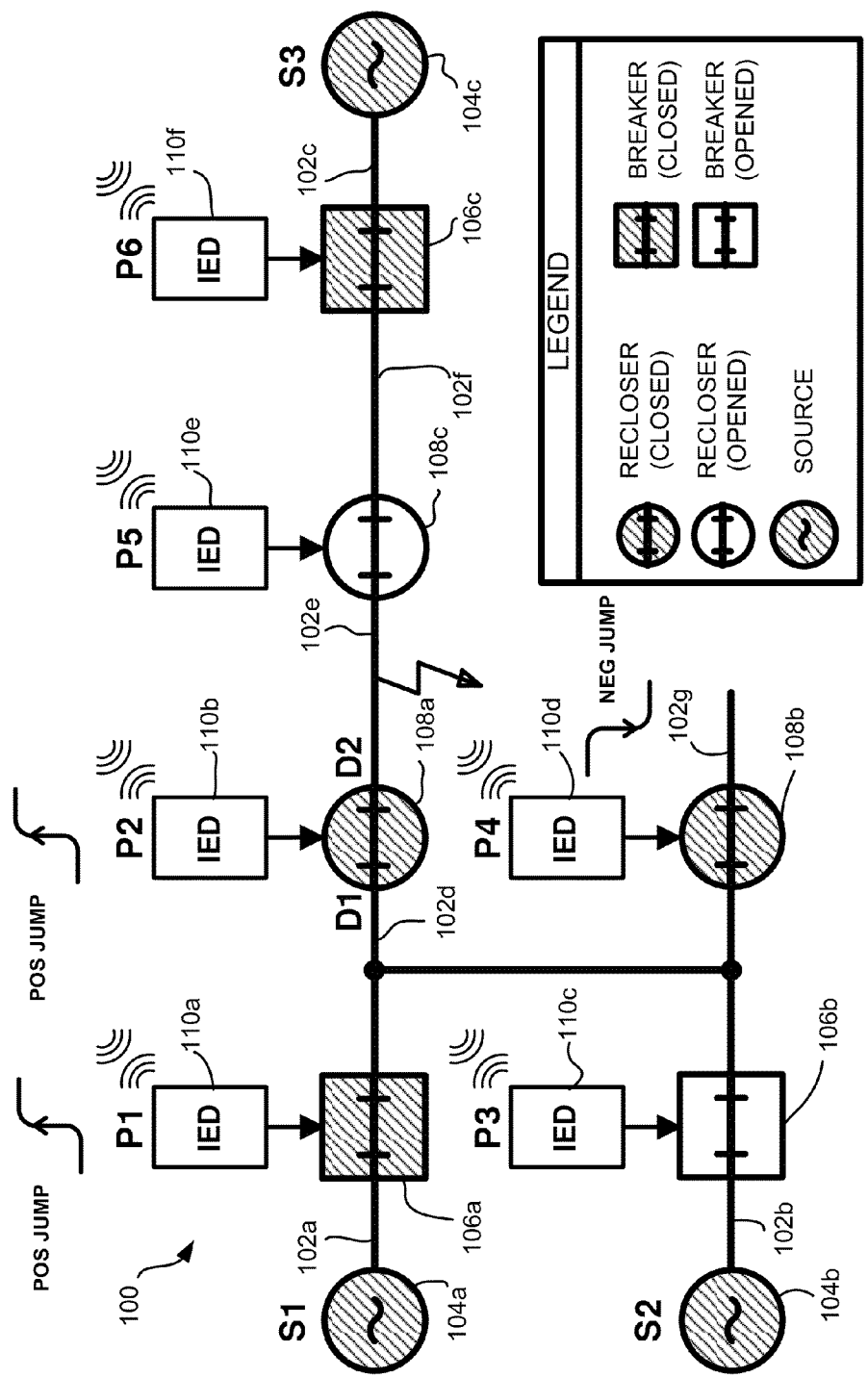
FIG. 15 is a schematic diagram of a third example of a faulted mesh-connected distribution feeder provided in accordance with various embodiments.

FIG. 15 illustrates the power distribution feeder system 100 in which a fault exists in line section 102e in accordance with various embodiments. Fault current is flowing through IED P1, but the protection logic of IED P1 should not operate because section 102d is not faulted.

IEDs P1 and P2 see a sudden current increase and issue "Own Positive Jump=" signals. IED P4 sees a sudden decrease of current in the faulted phases and issues an "Own Negative Jump=" signal. IED P3 is open and therefore does not detect any current jump.

IED P2 receives the positive jump signal from IED P1, but this signal will not cause a pickup in direction D1 because IED P2 detects its own positive current jump (e.g., if a device detects its own positive current jump, the device will not pickup in the direction from which another positive current jump signal has been received). In this case IED P1 will not receive pickup signal "PU D22>" from IED P2, AND gate 12 (FIG. 9B) in pickup confirmation logic 408 of IED P1 will remain inactive, and IED P1 will not detect a fault on the line section 102d. For the same reason, IED P1 will not trip if a positive current jump has been detected by IED P4 for a fault in line section 102g.

For IED P2, OR gate 2 (FIG. 6B) has an open status signal from IED P5. When IED P2 detects its own positive current jump, AND gate 5 drives OR gate 13 to sends an "87L PU D2" pickup signal to the direction D2 (FIG. 10B).

IED P5 receives the positive jump signal from IED P2 and sends an echo pickup signal back, because no own current jump is detected. When IED P2 receives this echo signal ("PU D22>"), AND Gate 12 (FIG. 9B) drives the AND Gates 14, 16 (FIG. 10B). This causes a fault detection in the direction D2 and a trip command as described previously.

Dead End Pickup Operation

Figure 16:
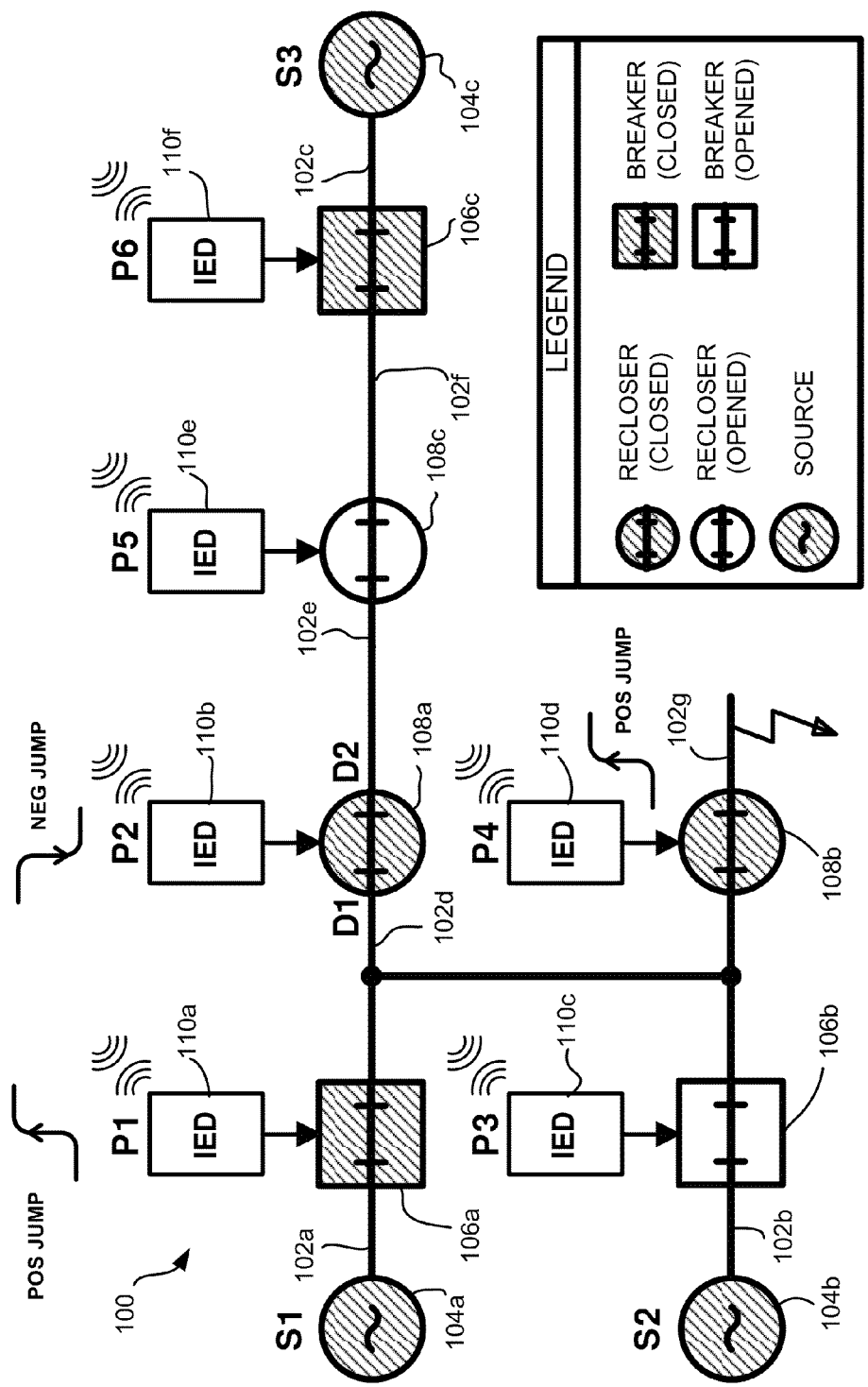
FIG. 16 is a schematic diagram of a fourth example of a faulted mesh-connected distribution feeder provided in accordance with various embodiments.

FIG. 16 illustrates the power distribution feeder system 100 in which a fault exists in line section 102g in accordance with various embodiments.

IEDs P1 and P4 see a sudden current increase and each issue a "Own Positive Jump=" signal. IED P2 sees a sudden decrease of current in the faulted phases and issues an "Own Negative Jump=" signal. IED P3 is open and does not detect any current jump.

The fault conditions for IED P1 are not fulfilled because IED P4 detects a positive jump downstream from IED P1. Actions 2, 3 and 4 are not performed because IED P4 is not connected to the any other device in the direction D2. Therefore dead end pickup logic 406 is employed (FIG. 8B).

A fault is detected in the direction D2 if IED P4 receives at least one positive jump signal from the direction D1 and its own Ground or Phase overcurrent element detects an overcurrent to confirm the fault. When IED P4 receives a positive jump signal "Pos Jump D11>" from IED P1 and its phase overcurrent element detects an overcurrent, OR gates 9 and 10 of dead end pickup logic 406 (FIG. 8B) drive AND gate 11, which activates OR Gate 15 (FIG. 10B) in the 87L general pickup logic 412. Once OR Gate 15 is activated, and if no blocking conditions exist, IED P4 detects the fault in the direction D2 and trips the primary switching device (recloser 108*b*).

Accordingly, while the present invention has been disclosed in connection with the example embodiments thereof, it should be understood that other embodiments may fall within the spirit and scope of the invention, as defined by the following claims.

The invention claimed is:

1. A power distribution feeder system including:
a plurality of power sources;
a plurality of switching components coupled to the power sources by a plurality of line sections;
an intelligent electronic device (IED) coupled to each switching component and configured to monitor any line section coupled to the switching component, each IED containing protection logic configured to:
detect a jump in current on a faulted line section;
communicate the jump in current to other IEDs coupled to the faulted line section;
receive information from the other IEDs coupled to the faulted line section regarding any jump in current detected by the other IEDs;
employ the received information from the other IEDs to confirm a fault in the faulted line section; and
issue a trip command to isolate the faulted line section based on the current jump detected by the IED and current jump information received from other IEDs coupled to the line section.

2. The system of claim 1 wherein the IEDs are configured to communicate at least one of wirelessly and peer-to-peer.

3. The system of claim 1 wherein the switching components include at least one of reclosers and circuit breakers.

4. The system of claim 1 wherein the protection logic of each IED is further configured to inhibit detection of a subsequent jump in current after detecting an initial jump in current.

5. The system of claim 1 wherein the protection logic of each IED is configured to detect both positive and negative jumps in current on a faulted line section and to communicate positive and negative current jump information to other IEDs coupled to the line section.

6. The system of claim 5 wherein each IED is further configured to generate a fault detection signal based on a positive current jump detected by the IED and negative current jumps detected by other IEDs coupled to the faulted line section.

7. The system of claim 5 wherein the protection logic of each IED is further configured to confirm any positive jump in current detected by the IED by confirming receipt of negative current jump information from other IEDs coupled to the faulted line section.

8. The system of claim 7 wherein the protection logic of each IED is further configured to generate a fault confirmation signal based on the confirmation of the positive current jump, and to communicate the fault confirmation signal to other IEDs coupled to the faulted line section.

9. The system of claim 5 wherein the protecting logic of each IED is further configured to confirm any negative jump in current detected by the IED by confirming receipt of positive current jump information from at least one other IED coupled to the faulted line section.

10. The system of claim 9 wherein the protection logic of each IED is further configured to generate a fault confirmation signal based on the confirmation of the negative current jump, and to communicate the fault confirmation signal to other IEDs coupled to the faulted line section.

11. The system of claim 1 wherein the protection logic of each IED is further configured to confirm receipt of a fault confirmation signal from all other IEDs coupled to the faulted line section.

12. The system of claim 1 wherein the protection logic of each IED is further configured to generate a fault confirmation signal if the IED does not detect either a negative current jump or a positive current jump in the faulted line section in response to communication of a positive current jump from another IED coupled to the faulted line section.

13. The system of claim 1 wherein the protection logic of each IED is further configured to use at least one of a ground and a phase overcurrent measurement to confirm any fault detection determined based on negative and positive current jumps communicated between IEDs coupled to the faulted line section.

14. An intelligent electronic device (IED) for use in a power distribution feeder system having a plurality of power sources and a plurality of switching components coupled to the power sources by a plurality of line sections, the IED comprising:
protection logic configured to:
detect a jump in current on a faulted line section;
communicate the jump in current to other IEDs coupled to the faulted line section;
receive information from the other IEDs coupled to the faulted line section regarding any jump in current detected by the other IEDs;
employ the received information from the other IEDs to confirm a fault in the faulted line section; and
issue a trip command to isolate the faulted line section based on the current jump detected by the IED and current jump information received from other IEDs coupled to the line section.

15. The IED of claim 14 wherein the IED is configured to communicate with other IEDs at least one of wirelessly and peer-to-peer.

16. The IED of claim 14 wherein the protection logic of the IED is further configured to inhibit detection of a subsequent jump in current after detecting an initial jump in current.

17. The IED of claim 14 wherein the protection logic of the IED is configured to detect both positive and negative jumps in current on a faulted line section and to communicate positive and negative current jump information to other IEDs coupled to the line section.

18. The IED of claim 17 wherein the IED is further configured to generate a fault detection signal based on a positive current jump detected by the IED and negative current jumps detected by other IEDs coupled to the faulted line section.

19. The IED of claim 17 wherein the protection logic of the IED is further configured to confirm any positive jump in current detected by the IED by confirming receipt of negative current jump information from other IEDs coupled to the faulted line section.

20. The IED of claim 19 wherein the protection logic of the IED is further configured to generate a fault confirmation signal based on the confirmation of the positive current jump, and to communicate the fault confirmation signal to other IEDs coupled to the faulted line section.

21. The IED of claim 17 wherein the protecting logic of the IED is further configured to confirm any negative jump in current detected by the IED by confirming receipt of positive current jump information from at least one other IED coupled to the faulted line section.

22. The IED of claim 21 wherein the protection logic of the IED is further configured to generate a fault confirmation signal based on the confirmation of the negative current jump, and to communicate the fault confirmation signal to other IEDs coupled to the faulted line section.

23. The IED of claim 14 wherein the protection logic of the IED is further configured to confirm receipt of a fault confirmation signal from all other IEDs coupled to the faulted line section.

24. The IED of claim 14 wherein the protection logic of the IED is further configured to generate a fault confirmation signal if the IED does not detect either a negative current jump or a positive current jump in the faulted line section in response to communication of a positive current jump from another IED coupled to the faulted line section.

25. The IED of claim 14 wherein the protection logic of the IED is further configured to use at least one of a ground and a phase overcurrent measurement to confirm any fault detection determined based on negative and positive current jumps communicated between IEDs coupled to the faulted line section.

26. A method of isolating a fault in a power distribution feeder system have a plurality of power sources and a plurality of switching components coupled to the power sources by a plurality of line sections, the method including:
providing an intelligent electronic device (IED) coupled to each switching component and configured to monitor any line section coupled to the switching component; and
employing a first IED to:
detect a jump in current on a faulted line section;
communicate the jump in current to other IEDs coupled to the faulted line section;
receive information from the other IEDs coupled to the faulted line section regarding any jump in current detected by the other IEDs;
employ the received information from the other IEDs to confirm a fault in the faulted line section; and
issue a trip command to isolate the faulted line section based on the current jump detected by the first IED and current jump information received from other IEDs coupled to the line section.

27. The method of claim 26 further comprising employing the first IED to generate a fault detection signal based on a positive current jump detected by the first IED and negative current jumps detected by other IEDs coupled to the faulted line section.

28. The method of claim 26 further comprising employing the first IED to confirm any positive jump in current detected by the first IED by confirming receipt of negative current jump information from other IEDs coupled to the faulted line section.

29. The method of claim 26 further comprising employing the first IED to confirm any negative jump in current detected by the first IED by confirming receipt of positive current jump information from at least one other IED coupled to the faulted line section.

30. The method of claim 26 further comprising employing the first IED to confirm receipt of a fault confirmation signal from all other IEDs coupled to the faulted line section.

31. The method of claim 26 further comprising employing the first IED to generate a fault confirmation signal if the first IED does not detect either a negative current jump or a positive current jump in the faulted line section in response to communication of a positive current jump from another IED coupled to the faulted line section.

32. The method of claim 26 further comprising employing the first IED to use at least one of a ground and a phase overcurrent measurement to confirm any fault detection determined based on negative and positive current jumps communicated between IEDs coupled to the faulted line section.

* * * * *